United States Patent
Endo

(10) Patent No.: US 8,119,516 B2
(45) Date of Patent: Feb. 21, 2012

(54) BUMP STRUCTURE FORMED FROM USING REMOVABLE MANDREL

(75) Inventor: Kimitaka Endo, Yokohama (JP)

(73) Assignee: Tessera Interconnect Materials, Inc., San Jose, CA (US)

( * ) Notice: Subject to any disclaimer, the term of this patent is extended or adjusted under 35 U.S.C. 154(b) by 263 days.

(21) Appl. No.: 12/290,873

(22) Filed: Nov. 4, 2008

(65) Prior Publication Data
US 2009/0121351 A1 May 14, 2009

(30) Foreign Application Priority Data
Nov. 14, 2007 (JP) ................. 2007-295299

(51) Int. Cl.
*H01L 21/44* (2006.01)
*H01L 23/043* (2006.01)
(52) U.S. Cl. ................. 438/613; 257/708; 257/E23.141
(58) Field of Classification Search .................. 438/613; 257/708, E23.141
See application file for complete search history.

(56) References Cited

U.S. PATENT DOCUMENTS

| 6,085,414 A * | 7/2000 | Swarbrick et al. ............... 29/847 |
| 6,419,149 B1 * | 7/2002 | Yano et al. .................. 228/235.1 |
| 6,528,874 B1 | 3/2003 | Iijima et al. |
| 2002/0076919 A1 * | 6/2002 | Peters et al. .................. 438/637 |
| 2003/0155653 A1 | 8/2003 | Iijima et al. |
| 2005/0097727 A1 | 5/2005 | Iijima et al. |

FOREIGN PATENT DOCUMENTS

| JP | 2001111189 | 4/2001 |
| JP | 2002359471 | 12/2002 |
| JP | 2003309370 | 10/2003 |

OTHER PUBLICATIONS

Japanese Patent Applciaton No. 2007-295299.

* cited by examiner

*Primary Examiner* — Kevin Parendo
(74) *Attorney, Agent, or Firm* — Lerner, David, Littenberg, Krumholz & Mentlik, LLP

(57) ABSTRACT

A method for forming a bump structure and a bump structure for conductive interconnection with another element having at least one of microelectronic devices or wiring thereon, used as an electric connection in an electronic circuit, includes the steps of forming a mandrel by steps including forming at least one opening extending through a bump-forming die body in the thickness direction thereof and positioning a bump-forming die lid on a surface of the bump-forming die body so as to cover one end of the opening and to thereby define a bump-forming recess. The bump-forming die body may be comprised of a metal sheet. A metal layer is formed at least on an inner surface of the bump-forming die lid exposed within the bump-forming recess. The mandrel is removed so as to expose the metal layer and form a bump structure.

19 Claims, 19 Drawing Sheets (j)

(k)

(l)

BUMP STRUCTURE FORMED FROM USING REMOVABLE MANDREL

CROSS-REFERENCE TO RELATED APPLICATIONS

The present application claims the benefit of Japanese Application Ser. No. 2007-295299, filed Nov. 14, 2007, entitled A PROCESS FOR FORMING A BUMP STRUCTURE AND A BUMP STRUCTURE, the disclosure of which is hereby incorporated herein by reference.

BACKGROUND OF THE INVENTION

The present invention relates to a process for forming a bump structure in an electronic circuit implementation and the bump structure and, more particularly, relates to a process for forming a bump structure for a circuit implementation in an electronic device such as IC for use in an electronic apparatus, and relates to the bump structure. Further, the present invention relates to a bump-structure forming member for forming the bump-structure, a process for manufacturing thereof, a circuit board having bumps formed thereon and a process for manufacturing thereof.

Conventionally, as a method for connecting an IC chip or the like having a plurality of connecting terminals to a printed wiring board (PWB) using the bumps in order to intensify the implementation density of an electronic circuit, land grid array (LGA) type connecting style has been known. If one surface of a chip or an intermediate board called an interposer or a substrate is loaded with an IC in order to connect a terminal or a wiring on the PWB to a wiring of a chip like the IC, the bumps for securing electrical connection with the PWB are formed on one surface of that interposer.

To construct the PWB in a high density, a multilayered board, such as a build-up board has been known. Using this, an electronic circuit component is mounted on each of both faces of a circuit board according to, for example, surface mount technology. Alternatively, in order to make conductive electric wirings of respective layers between adjacent layers or between desired layers, an interlayer connecting portion is provided via holes called via-hole provided for securing conductivity. A method of using the bumps as this interlayer connecting portion has been known (for example, Japanese Patent Application Laid-Open No. 2002-359471).

As a process for forming the bumps in these cases, for example, a process by electric plating using plating resist such as dry film resist (DFR) has been known. According to an example of this process, first, plating resist having an opening is provided on a conductive layer of copper foil or the like. Next, metal such as copper may be deposited in this opening by electric plating. By removing the plating resist after the electric plating treatment, the bumps projecting from the conductive layer are obtained.

As well as the process by the electric plating using plating resist described above, a process for forming the bump by etching has been known (for example, Japanese Patent Application Laid-Open No. 2003-309370).

An example of the process for forming the bump structure by etching will be described briefly with reference to FIG. 19.

As shown in FIG. 19(a), a multilayer metal sheet 200 is prepared. The multilayer metal sheet 200 is obtained by overlaying a wiring film forming metal layer 203 on a main surface of a bump-forming metal layer 201 via an etching barrier layer 202. As an example, the bump-forming metal layer 201 is a copper foil having a thickness of 100 μm, the etching barrier layer 202 is nickel having a thickness of 2 μm and the wiring film forming metal layer 203 is a copper foil having a thickness of 18 μm.

As shown in FIG. 19(b), an etching resist 204 is formed selectively on the surface of the bump-forming metal layer 201. As shown in FIG. 19(c), the bump-forming metal layer 201 is etched with the etching resist 204 used as a mask. After the etching, the etching resist 204 is removed as shown in FIG. 19(d). Then, the etching barrier layer 202 is etched as shown in FIG. 19(e). Consequently, a bump 205 projecting from the wiring film forming metal layer 203 is formed.

However, when a plurality of bumps is formed according to the aforementioned method by electric plating using plating resist, the height of the formed bumps may disperse because metal is deposited within each opening of the plating resist. According to this method, the height of the bump depends on the thickness of the plating resist. Some implementations of the electronic circuit need bumps having a large height. If a semiconductor chip is mounted on a printed board using, for example, a flip-chip method, the bump having a large height is desirable. However, there is a limitation in the thickness of material which constitutes the plating resist, such as DFR on market. Thus, it is difficult to raise the height of the bump.

On the other hand, the aforementioned method by etching can suppress the dispersion of the bump height more effectively than the method by electric plating, because the metal layer is etched with the etching resist used as a mask. Additionally, the above-mentioned problem originating from the height of the plating resist never occurs. However, if the bump is formed by etching, the surface of the metal layer, that is, a portion near a surface in a contact with the etching resist is etched more for the reason of the character of etching technology, and as the bottom portion of the metal layer is approached, the degree of the etching makes smaller. Thus, as shown in FIG. 19(c) to 19(e), the configuration of the bump may turn to substantially frusto-conical. As an example, if a bump about 0.1 mm in height is produced by the method by etching, the diameter of its top face is about 0.1 mm and the diameter of its bottom portion is about 0.15 mm. Therefore, if it is desired to form a bump having a larger height with respect to the diameter of the bottom portion, that is, a bump having a high aspect ratio, the method by etching has a limitation.

Additionally, there is a limitation by the etching resist. For, example, if it is intended to create a plurality of bumps in which the diameter of the top face is 0.1 mm, the height thereof is 0.1 mm and the diameter of the bottom portion is 0.15 mm according to the method by etching, it is necessary to use etching resist having a diameter of about 0.3 mm for each bump. If a plurality of the bumps is produced, it is necessary, to provide a gap which osmoses etching solution between an etching resist for forming a bump and an etching resist for forming an adjacent bump. At this time, it comes that respective bumps are located apart at least about 0.33 mm because this gap needs to be about 0.03 mm if considering the character of the DFR or the like. Therefore, the interval of the bumps, that is, the accuracy of a fine pitch is limited by the etching resist.

SUMMARY OF THE INVENTION

The embodiments disclosed herein provide solutions to the problems of the related art and provide a process for forming a bump structure and the bump structure which can achieve a bump having a high aspect ratio. Even if a plurality of bumps is formed, dispersion of the height of the bumps is small and a fine pitch between the bumps can be achieved.

The bump-forming process of the present invention is a forming process for the bump structure for use as an electric connection in electronic circuit implementation. The process for forming the bump structure of the claimed embodiments includes the steps of: forming a mandrel from a die body and a die lid by forming at least one opening extending through a bump-forming die body in the thickness direction thereof, the bump-forming die body including a metal sheet; and positioning a bump-forming die lid against the bump-forming, die body so as to cover one end of the opening, thereby defining a bump-forming recess. Additional steps for forming the bump structure include forming a metal layer at least on an inner surface of the bump-forming lid exposed within the bump-forming recess; and removing the mandrel so as to expose the metal layer.

The bump-forming die body may have a uniform thickness and the process for forming the bump structure may include the steps of: forming a plurality of openings extending through the bump-forming die body in the thickness direction thereof; positioning a bump-forming die lid against the bump-forming die body so as to cover one end of each of the opening, thereby defining a plurality of bump-forming recesses; forming a metal layer at least on the inner surface of each bump-forming recess; and forming a bump structure which includes protrusions formed of the metal layer, by removing the mandrel so as to expose the metal layer.

The bump structure having the recesses can be used such that it is joined to various kinds of supporting members, depending on a fashion at the time of implementation of the circuit or applications. The supporting members mentioned herein refer to generally a matter provided with the bump structure, including hips such as IC, a semiconductor loading intermediate board comprised of polyimide film or glass fiber reinforced resin substrate usually called an interposer (or a substrate) in an electronic component loading technology field, element board which constitutes a multilayer printed wiring board, an inspection jig for securing temporary conduction for a socket for loading a semiconductor chip or inspection, and a resin filled section for sealing the semiconductor chip of a circuit board for use for improvement of implementation density by burying a semiconductor chip internally.

The opening is formed by, for example, using an NC drill, punching, or laser machining. As another example, the hole is opened by etching the bump-forming die body from opposite sides thereof.

For example, the metal layer may be formed by plating a metal from a surface of the bump-forming die body on which an opening of the bump-forming recess is formed, onto the inner surface of the bump-forming recess. The metal layer may be formed by pattern-plating, and at this time a wiring pattern may be formed. As another example, the wiring pattern may be formed by etching the metal layer after the metal layer is formed. A gold-plated layer may be formed at least on the inner surface of the bump-forming recess, and then the metal layer may be disposed upon the gold-plated layer.

The bump-forming die lid positioned against the bump-forming die body may be press-welded to the bump-forming die body by high-temperature pressing.

The bump-forming die body and/or the bump-forming die lid may be copper-based metal members, wherein the metal layer is formed as a copper-based metal layer by forming a nickel-based metal layer as a etching barrier layer on the inner surface of the bump-forming recess and then plating a copper-based metal upon the etching barrier layer, wherein the bump-forming die body and the bump-forming die lid are removed using an alkaline etching solution, and then the etching barrier layer is removed.

Furthermore, the bump-forming die body may include a metal sheet formed by stacking a plurality of metallic foils on top of one another, wherein the step of forming an opening may include forming an opening in each of a plurality of metallic foils such that the opening extending through the metallic foil in the thickness direction thereof, and stacking a plurality of metallic foils on top of one another such that the openings are aligned with each other, whereby an opening extending through the bump-forming die body in the thickness direction thereof is defined. In this case, for example, at least two of the openings in a plurality of foils may differ in diameter. As an example, the step of forming an opening includes forming another opening in at least one of a plurality of metallic foils other than that contacting with the bump-forming die lid.

An alternative bump structure formed according to the process for forming the bump structure includes a flat upper surface of the protrusion formed of the metal layer, and an edge defined by the intersection of the upper surface and a side surface of the protrusion.

A method for manufacturing a bump-surface forming member used for forming a bump structure used as an electric connection in an electronic circuit implementation is also disclosed. The method for manufacturing the bump-structure forming member includes the steps of: forming a mandrel from a bump-forming die body and a bump-forming die lid by forming an opening extending through a bump-forming die body in the thickness direction thereof, the bump-forming die body including a metal sheet; and positioning a bump-forming die lid against the bump-forming die body so as to cover one end of the hole, thereby defining a bump-forming recess, the bump-forming die lid including a metal sheet; and forming a metal layer at least on the inner surface of the bump-forming recess.

Further, a bump-structure forming member used for forming a bump structure used as an electric connection in an electronic circuit implementation is disclosed. The bump-structure forming member includes: a bump-forming die body having at least one hole extending through the bump-forming die body in the thickness direction thereof, the bump-forming die body including a metal sheet; a bump-forming die lid which is positioned against the bump-forming die body so as to cover one end of the hole, thereby defining a bump-forming recess, the bump-forming die lid including a metal sheet; and a metal layer formed at least on an inner surface of the bump-forming recess.

The bump-structure forming member may include a member in a state in which the metal layer formed in the bump-forming recess remains formed in the bump-forming recess without being removed from the bump-forming die body and the bump-forming die lid. For example, by distributing the members in this state through the market, a purchaser can form a wiring pattern on that member or overlay a circuit board. Removal of the bump-forming die body and the bump-forming die lid at a stage in which a desired processing is completed, a desired circuit board in which the bump structure is formed can be achieved. Because the bump-structure forming member is in the state in which the bump-forming die body and the bump-forming die lid are not removed, the bump-forming die body and the bump-forming die lid take a role of a supporting body, which is convenient for distribution as a product and subsequent processing.

The present embodiments also disclose a method for manufacturing a circuit board having a bump formed thereon.

The process for manufacturing a circuit board having a bump formed thereon includes the steps of: forming a mandrel from a bump-forming die body and a bump-forming die lid by steps including forming an opening extending through a bump-forming die body in the thickness direction thereof, the bump-forming die body including a metal sheet; and positioning a bump-forming die lid against the bump-forming die body so as to cover one end of the opening, thereby defining a bump-forming recess, the bump-forming die lid including a metal sheet; forming a metal layer, from a surface of the bump-forming die body on which an opening of the bump-forming recess is formed, onto the inner surface of the bump-forming recess, the metal layer including a predetermined wiring pattern; placing a circuit board upon the metal layer; and forming a bump structure including a protrusion formed of the metal layer, by removing the mandrel so as to expose the metal layer.

In each of the above-described steps, after the circuit board having the bump structure is obtained, the solder mask may be formed at a desired position of both main surfaces of the circuit board, that is, a surface having the protrusions of the circuit board and a surface on a side opposing the surface. At this time, the solder mask is formed such that the surface of the protrusion is exposed. Further, after the solder mask is formed, the nickel plating layer and the gold plating layer may be formed on the surface or the top face of the protrusion to prepare for soldering work at the time of circuit implementation.

Further, the circuit board to be overlaid on the metal layer may be a multilayered circuit board such as a build-up board.

According to another embodiment, a circuit board having a bump formed thereon is manufactured according to the process for manufacturing the circuit board having the bump formed thereon. In this embodiment, an upper surface of the protrusion formed of the metal layer is flat, and the upper surface and a side surface of the protrusion intersect to define an edge.

According to another embodiment for a process for forming a bump structure, the opening is formed in the thickness direction of the bump-forming die body, one end of the opening is covered by the bump-forming die lid so as to form the bump-forming recess, and the metal layer formed on the inner surface of the bump-forming recess is removed so as to obtain the bump structure having the protrusion formed by the metal layer.

Thus, there is no restriction by plating resist unlike the electric plating method using the plating resist. Further, because the above-mentioned process enables the height of the formed protrusion, that is, the height of the bump to be adjusted by changing the thickness of the bump-forming die body, the bump having a larger height than by a method by the electric plating using the plating resist or a method by etching can be formed. Because the diameter of the bump to be formed can be adjusted by changing the diameter of the opening of the bump-forming recess, a bump having a high aspect ratio can be formed.

If a plurality of the bumps is formed according to this process, the height of each bump is defined by the thickness of the bump-forming die body, thereby suppressing the dispersion of the height. Further, because there is no restriction by etching resist unlike by the method by etching, a fine pitch between the bumps can be achieved.

DETAILED DESCRIPTION

Hereinafter, the embodiments disclosed herein will be described with reference to the accompanying drawings.

Figure 1:
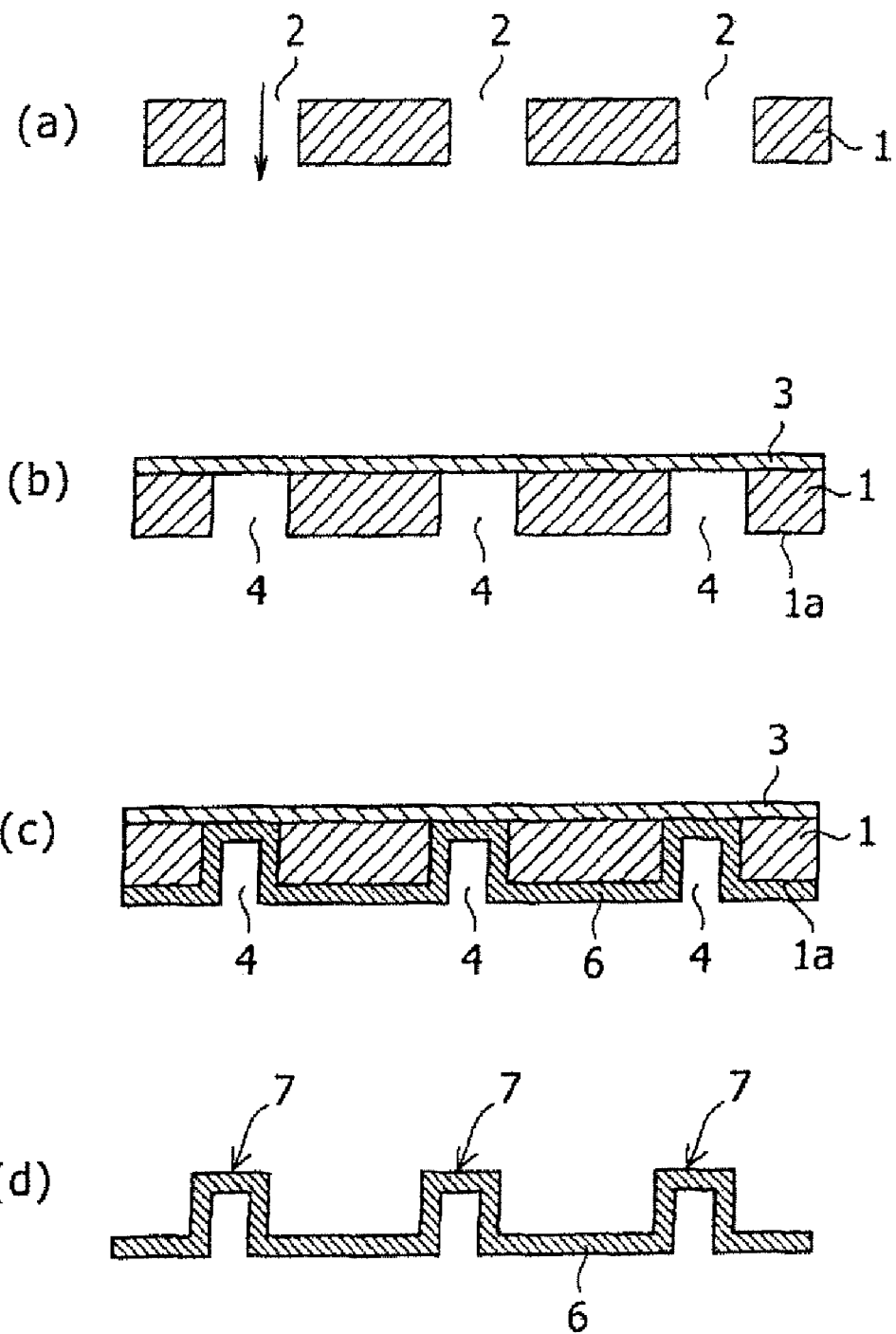
FIGS. 1($a$)-($d$) are schematic sectional views showing a first embodiment of the process for forming the bump structure according to one embodiment in a sequence of steps.

FIG. 1 is a schematic sectional view showing an embodiment of the process for forming a bump structure in a sequence of steps. A mandrel is defined by a bump-forming die body 1 and a bump-forming die lid joined thereto. Referring to FIG. 1($a$), a bump-forming die body 1 is prepared. According to this embodiment, the bump-forming die body 1 is, for example, a rolled copper foil having a thickness of 200 μm. A plurality of through holes 2 are formed in the bump-forming die body. The through holes 2 may be formed in the thickness direction of the rolled copper foil using an NC drill. In this embodiment, the walls of the through holes 2 can be perpendicular to one of the top surface and bottom surface of the bump-forming die body 1. The walls of the through holes 2 can be parallel to each other. This is in contrast to other embodiments, for example, wherein the opening can be tapered so as to decrease in diameter towards the bottom surface. An opening of each through hole 2 may be circular and the diameter of the opening is, for example, 200 µm. The end of the opening at the top surface of the bump-forming die body 1 and the end of the opening at the bottom surface of the bump-forming die body 1 may also have the same or substantially the same diameter.

As shown in FIG. 1(*b*), a bump-forming die lid 3 formed of a metal sheet may be overlaid on the main surface of the bump-forming die body 1 having through holes 2 and press-welded to the main surface. In this embodiment, the bump-forming die lid 3 may be, for example, a rolled copper foil having a thickness of 70 µm, although other metals may suffice. The opening on one side of the through hole 2 is covered by the bump-forming die lid 3, so as to form a bump-forming recess 4 which is defined by the inner surface of the through hole 2 and the bump-forming die lid 3. No adhesive layer exists between the bump-forming die body 1 and the bump-forming die lid 3. The contact surfaces of the bump-forming die body 1 and the bump-forming die lid 3 are treated by wet soft etching. The bump-forming die body 1 and the bump-forming die lid 3 are pressed against each other at a high-temperature (for example, about 350° C.), so that the bump-forming die body 1 and the bump-forming die lid 3 are press-welded together.

Because the mandrel, in this embodiment, is defined by the bump-forming die body 1 including the rolled copper foil and the bump-forming die lid 3, the inner wall of the recess 4 is conductive. Once the mandrel is formed, as shown in FIG. 1(*c*), a continuous surface from a surface la of the bump-forming die body 1 in which the opening of the bump-forming recess 4 is formed toward the interior of the bump-forming recess 4. The continuous surface may be plated with electrolytic nickel, so as to form a nickel plating layer 6 of, for example, 20 µm in a thickness. According to this embodiment, the surface 1*a* in which the openings of the bump-forming recess 4 are formed is plated with electrolytic nickel continuously. Therefore, in adjacent bump-forming recesses 4, the nickel plating layer 6 is formed continuously from the interior of one of the bump-forming recesses up to the interior of the other bump-forming recess.

The bump-forming die body 1 and the bump-forming die lid 3 may be removed by etching with alkaline etching solution (hereinafter referred to as alkaline etching). As shown in FIG. 1(*d*), by removing the mandrel, comprised of the bump-forming die body 1 and the bump-forming die lid 3, a bump structure having a plurality of the bumps 7 comprised of the nickel plating layer 6 can be obtained. The height and the top face diameter and bottom portion diameter of the formed bump 7 are 200 µm, respectively.

The bump 7 may be constructed in a cylindrical configuration depending on the configuration of the bump-forming recess 4. Because the bump-forming recess 4 is defined by the bump-forming die body 1 in which the through holes 2 are formed and the metal bump-forming die lid 3 which closes the openings on one side of the through holes 2, the top face of the bump 7 is flat while an intersecting portion between the top face and the side face of the bump 7 forms an angular edge.

According to the embodiment of FIGS. 1(*a*)-(*d*), a bump structure in which a ratio between the height, top face diameter and bottom portion diameter of each bump is 1:1:1 while the dispersion of each bump height is 10% or less can be obtained. Further, the ratio between the height, top face diameter and bottom portion diameter of each bump can be adjusted by changing the thickness of a metal member which constitutes the bump-forming die body 1 and/or by changing the diameter of the through hole 2. Thus, a bump having a high aspect ratio can be achieved.

Because the height of the bump 7 depends on the thickness of the bump-forming die body 1, a larger bump height can be achieved by increasing the thickness of the bump-forming die body 1. Additionally, because there is no restriction by the etching resist described above unlike the conventional etching method, a fine pitch between the bumps can be realized by shortening a distance between the adjacent through holes 2 when the through holes 2 are formed.

It is to be appreciated that the formation of a bump structure is not limited to the aforementioned description of a bump structure. Various embodiments are possible depending on the compatibility with a circuit or the purpose of the embodiment. For example, other embodiments will be described herein.

Figure 2:
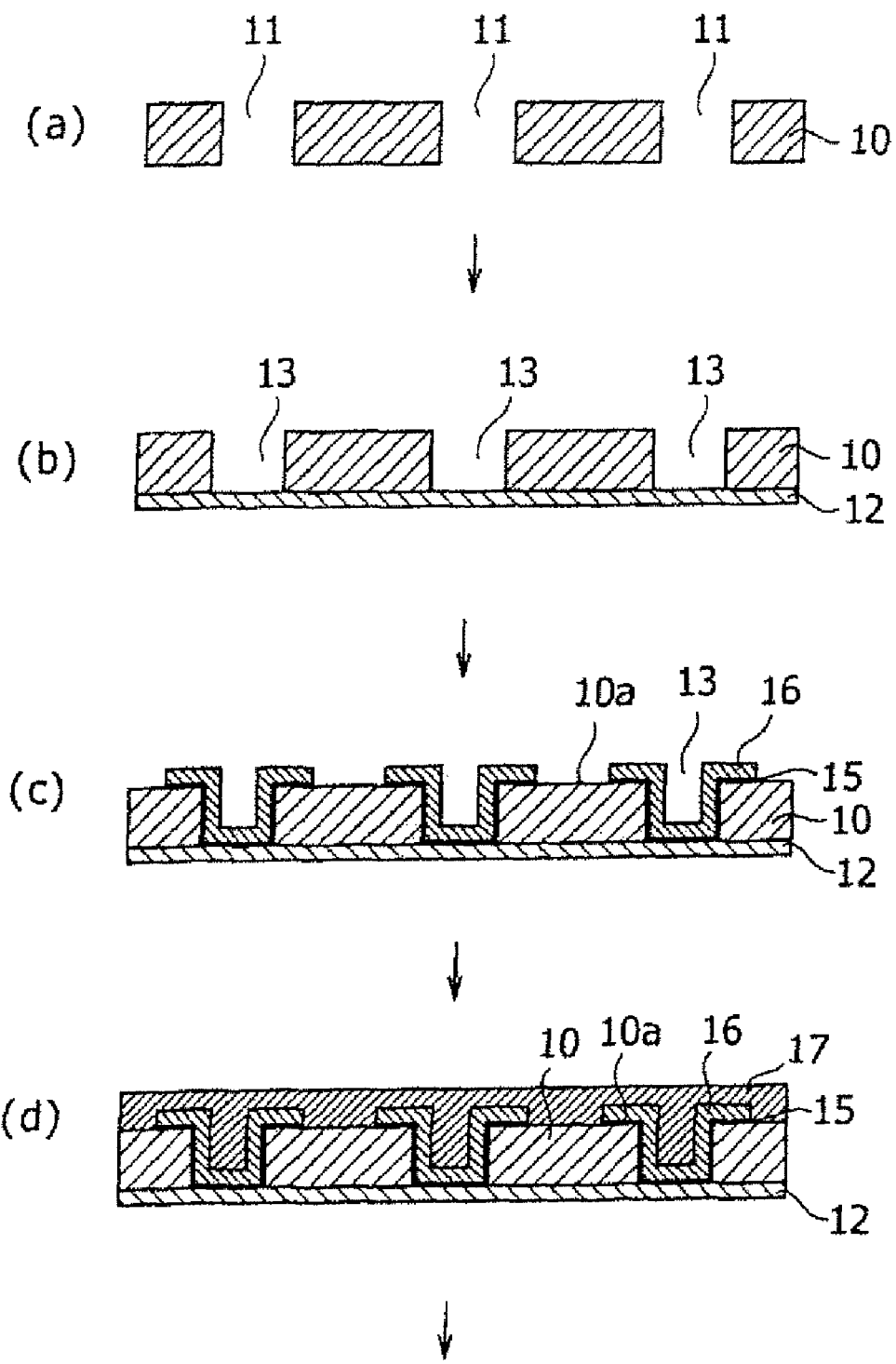
FIGS. 2($a$)-($d$) are a schematic sectional views showing a second embodiment of the process for forming the bump structure in a sequence of steps.
Figure 3:
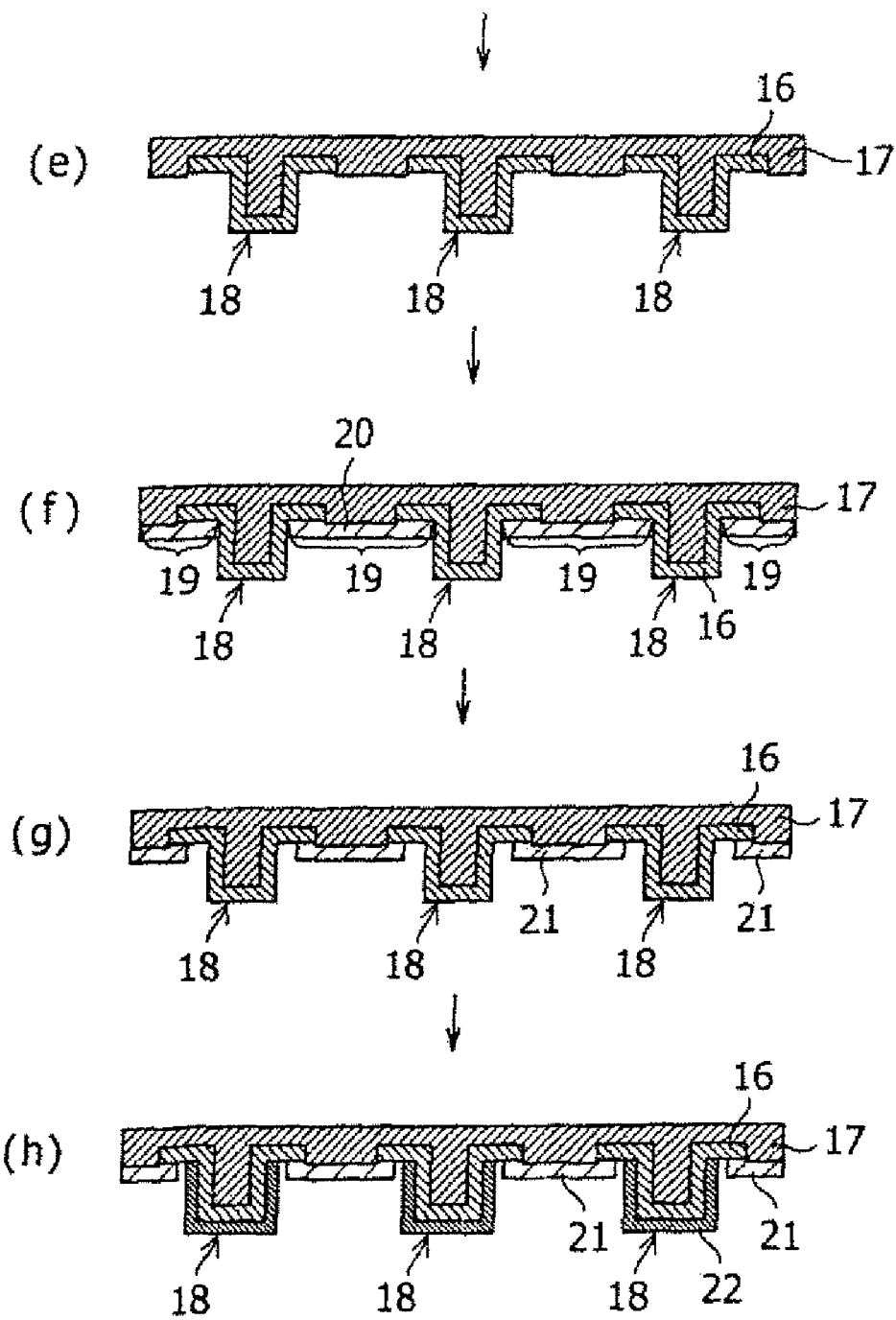
FIGS. 3($e$)-($h$) are a schematic sectional views showing the second embodiment of the process for forming a bump structure in a sequence of steps.

FIGS. 2 and 3 are schematic sectional views showing the process for forming the bump structure according to another embodiment of the present invention in a sequence of steps. The step of forming a mandrel from a bump-forming die body 10 and bump-forming die lid 12 attached thereto as shown in FIGS. 2(*a*)-(*b*). As shown, through holes 11 may be formed in the bump-forming die body 10 shown and the bump-forming recess 13 is formed when the bump-forming die lid 12 shown in FIG. 2(*b*) is positioned adjacent the bump-forming die body. The steps forming the mandrel are identical to the embodiment of FIGS. 1(*a*)-(*d*).

Once the mandrel is formed, a continuous surface from a surface 10*a* of the bump-forming die body 10 in which the openings of the bump-forming recess 13 are formed up to the interior of the bump-forming recess 13 is plated with electrolytic nickel so as to form a nickel plating layer 15. Electrolytic copper plating may be implemented on the nickel plating layer 15 so as to form a copper plating layer 16. Because the nickel plating layer 15 and the copper plating layer 16 may be formed by pattern plating using plating resist (not shown), no continuous nickel plating layer 15 or copper plating layer 16 is formed on the surface 10*a* located between the adjacent bump-forming recesses 13, different from the embodiment of FIGS. 1(*a*)-(*d*). That is, according to this embodiment, a wiring pattern is formed at the same time when the copper plating layer 16 is formed.

As shown in FIG. 2(*d*), dielectric member such as glass cloth epoxy prepreg may be pressed to the bump-forming die body 10 in which the nickel plating layer 15 and the copper plating layer 16 are formed so as to form an insulation layer 17 which fills the interior of the bump-forming recess 13 while covering the surface 10*a* of the bump-forming die body 10 and the surface of the copper plating layer 16.

As shown in FIG. 3(*e*), the mandrel, comprised of the bump-forming die body 10 comprised of a rolled copper foil and the bump-forming die lid 12, may be removed by alkaline etching. At this time, the nickel plating layer 15 takes a role as the etching barrier layer. The nickel plating layer 15 may be removed by stripping the nickel. Consequently, a plurality of bumps 18 made of the copper plating layer 16 is produced.

As shown in FIG. 3(*f*), a surface 19 which is a plane from which the bumps 18 may project and comprised of the insulation layer 17 and the copper plating layer 16 may be coated with photosensitive material for a solder mask so as to form a photosensitive material layer 20. As shown in FIG. 3(*g*), the photosensitive material layer 20 may be exposed using a photo mask (not shown) and developed so as to form a solder mask 21 between the adjacent bumps 18.

As shown in FIG. 3(h), electroless gold plating may be implemented to the surface of the bump 18 so as to form a gold plating layer 22. The gold plating layer 22 is provided to prevent the copper of the copper plating layer 16 from diffusing to the solder in soldering at the time of the circuit implementation.

When forming the gold plating layer 22, electroless nickel plating is implemented to the surface of the bump 18 before the gold plating is executed, so as to form a nickel plating layer (not shown). Further, in soldering at the time of the circuit implementation, oxide film may be formed on the nickel plating layer. Thus, soldering cannot be made directly to the nickel plating layer.

The bump 18 formed according to this embodiment can be used as, for example, a connecting means for mounting a semiconductor chip to a mother board (printed board).

Figure 4:
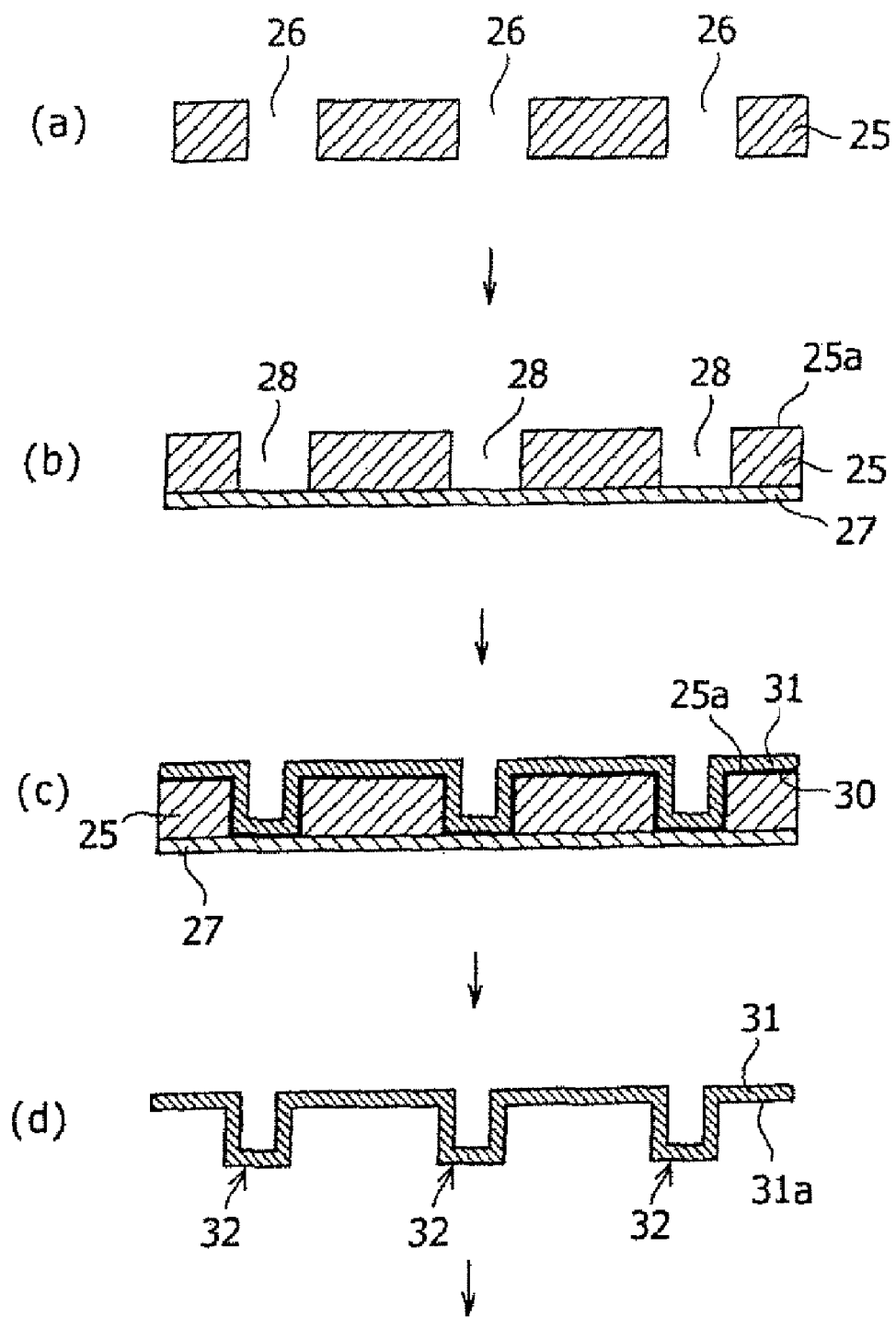
FIGS. 4($a$)-($d$) are a schematic sectional views showing a third embodiment of the process for forming a bump structure in a sequence of steps.
Figure 5:
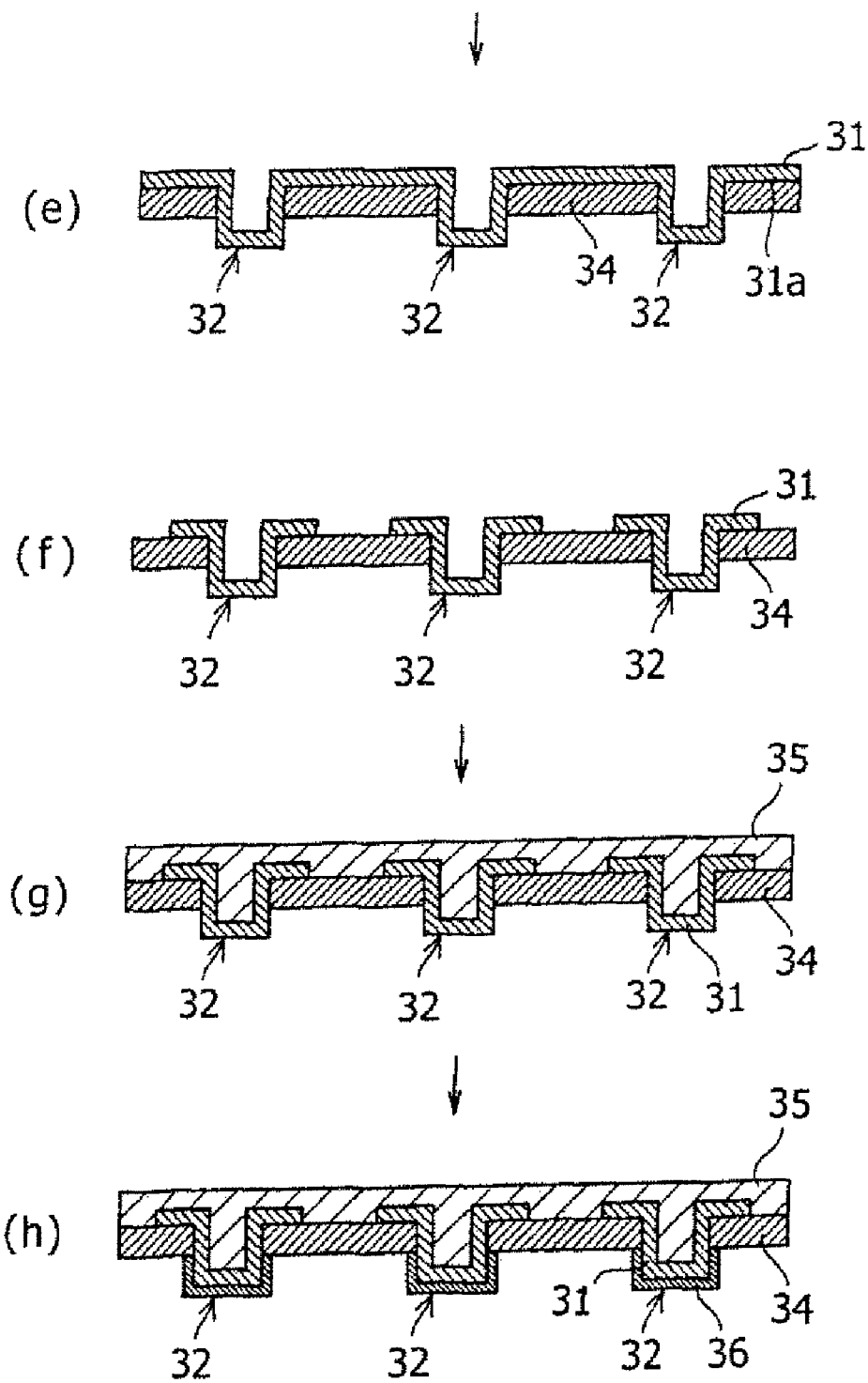
FIGS. 5($e$)-($h$) are a schematic sectional views showing the third embodiment of the process for forming a bump structure in a sequence of steps.

FIGS. 4 and 5 are schematic sectional views showing another embodiment of the process for forming a bump structure in a sequence of steps. The step of forming a mandrel from a bump-forming die body 25 (with openings 26 extending therethrough) and a bump-forming die lid 27 disposed adjacent the bump-forming die body 25 is shown in FIGS. 4(a) and 4(b). The bump-forming recess 28 formed from the mandrel is shown in FIG. 4(b). The process may be identical to the embodiment of FIGS. 1(a)-(d).

Electrolytic nickel plating may be implemented to a continuous surface from a surface 25a of a bump-forming die body 25 in which openings of the bump-forming recesses 28 are formed up to the inner surface of the bump-forming recess 28, so as to form a nickel plating layer 30. Electrolytic copper plating may be implemented to the nickel plating layer 30 so as to form a copper plating layer 31, as shown in FIG. 4(c). In the adjacent bump-forming recesses 28 of this embodiment, the nickel plating layer 30 and the copper plating layer 31 are formed continuously from the interior of one of the bump-forming recesses up to the interior of the other bump-forming recess.

Referring to FIG. 4(d), the mandrel, comprised of the bump-forming die body 25 and the bump-forming die lid 27 which are comprised of the rolled copper foil, may be removed by alkaline etching with the nickel plating layer 30 used as an etching barrier layer. The nickel plating layer 30 is removed by stripping the nickel. Consequently, a plurality of the bumps 32 made of the copper plating layer 31 is produced.

As shown in FIG. 5(e), a dielectric member such as glass cloth epoxy prepreg is pressed to a plane 31a from which the bumps 32 are projected and which is formed of the copper plating layer 31 so as to form an insulation layer 34.

The copper plating layer 31 may be pattern-etched as shown in FIG. 5(f). As shown in FIG. 5(g), a solder mask layer 35 which fills the interior of each bump 32 and covers the surfaces of the insulation layer 34 and the copper plating layer 31 may be formed.

As shown in FIG. 5(h), electroless gold plating is implemented to the surface of the bumps 32 so as to form a gold plating layer 36. To prevent diffusion of gold, a nickel plating layer (not shown) is formed by applying the electroless nickel plating to the surface of the bumps 32 before gold plating is executed.

The bumps 32 formed in this embodiment can be used as, for example, a connecting means for mounting a semiconductor chip onto a mother board (printed board).

Figure 6:
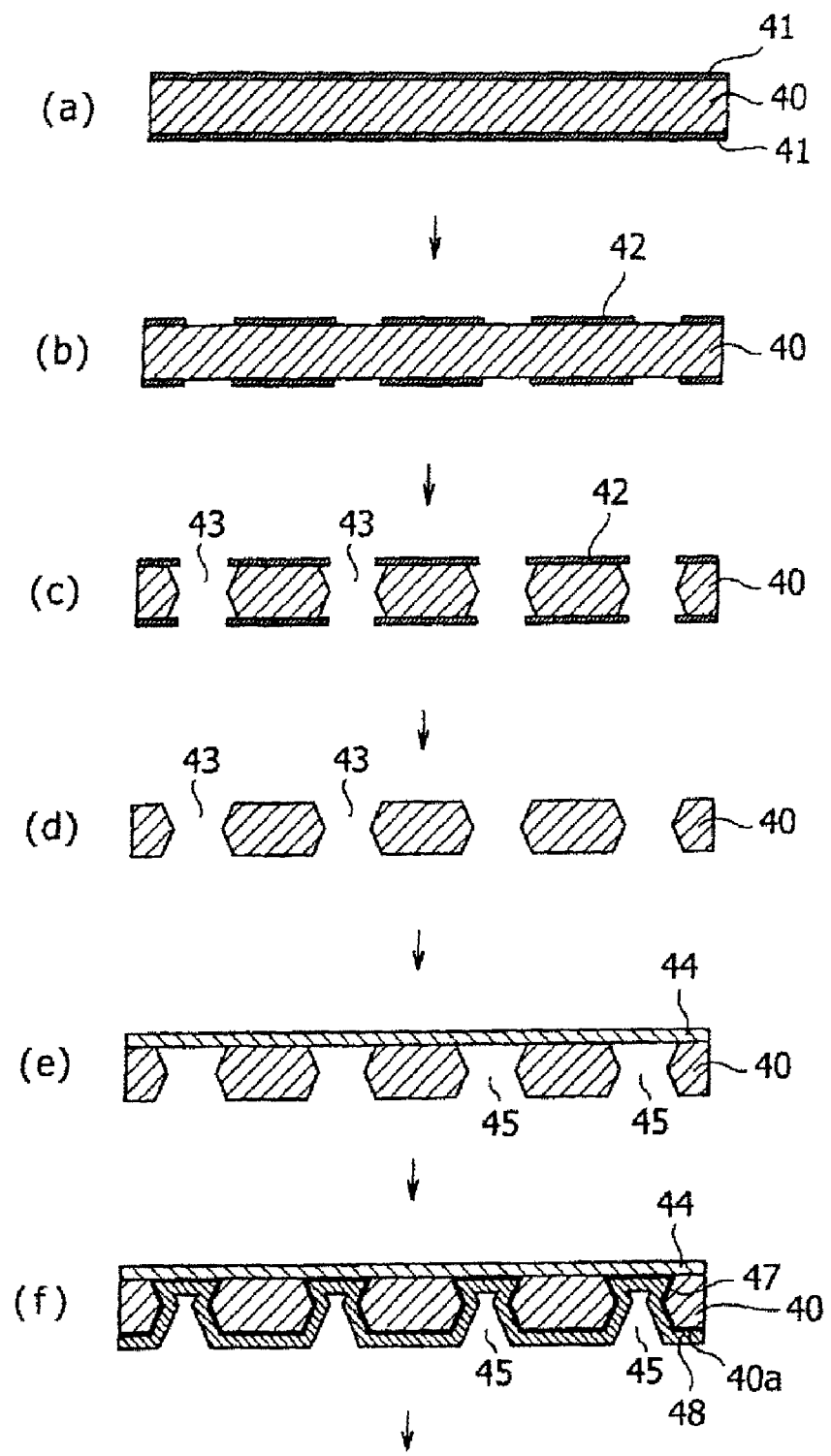
FIGS. 6($a$)-($f$) are a schematic sectional views showing a fourth embodiment of the process for forming a bump structure in a sequence of steps.
Figure 7:
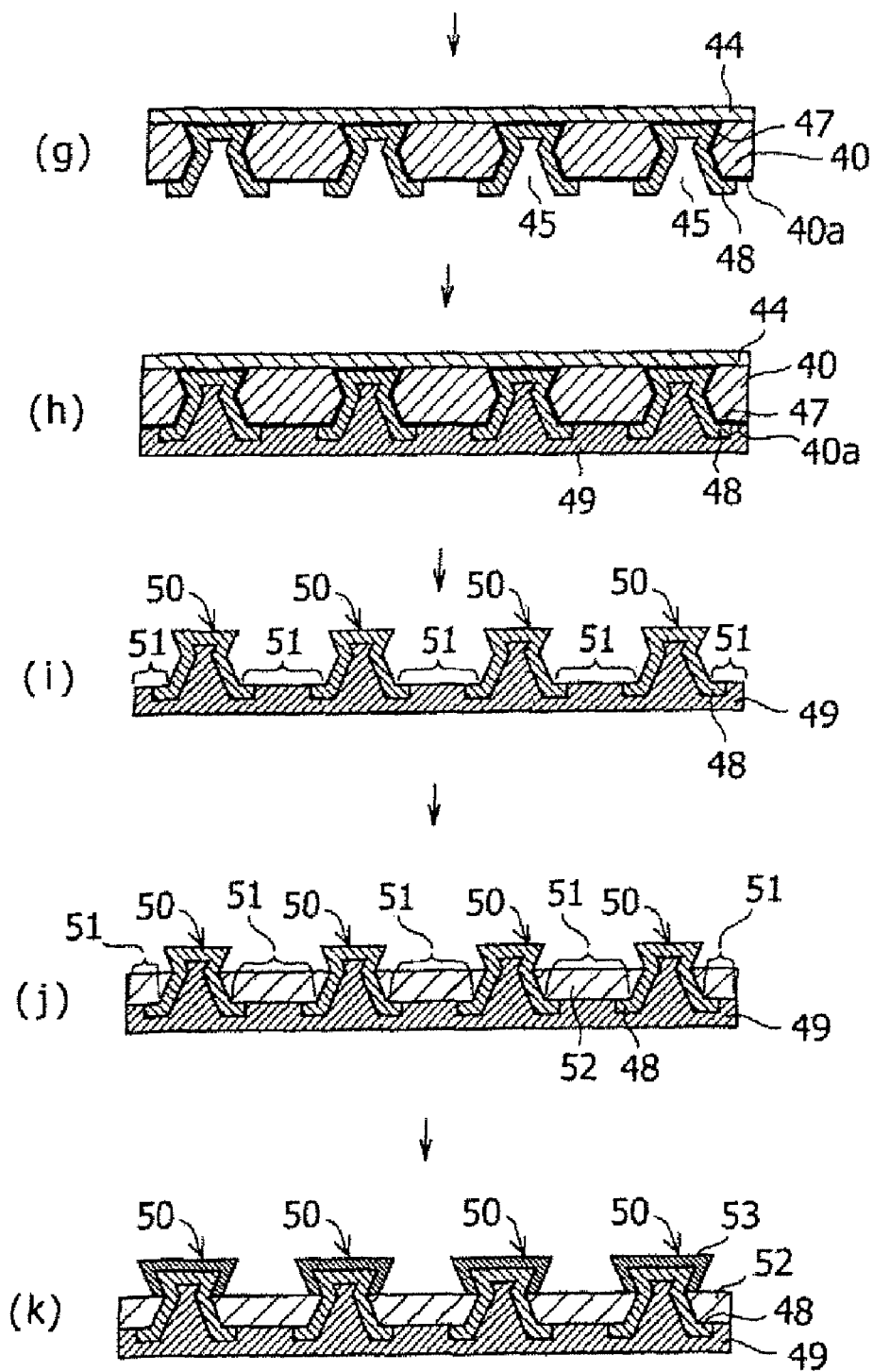
FIGS. 7($g$)-($k$) are a schematic sectional views showing the fourth embodiment of the process for forming a bump structure in a sequence of steps.

FIGS. 6 and 7 are schematic sectional views showing another embodiment of the process for forming the bump structure in the order of steps. First, as shown in FIG. 6(a), a dry film 41 is affixed to both main surfaces of a bump-forming die body 40 comprised of a tabular rolled copper foil.

Referring to FIG. 6(b), the dry film 41 may be exposed using a photo mask (not shown) and developed so as to remove the dry film 41 selectively, thereby forming a dry film resist 42. At this time, of the dry film 41 affixed to the main surface on one side of the bump-forming die body and the dry film 41 affixed to the main surface on the other side, dry films at corresponding positions via the bump-forming die body 40 are removed, respectively.

With the dry film resist 42 used as etching resist, the bump-forming die body 40 may be etched in the thickness direction of the bump-forming die body 40 from both main surfaces of the bump-forming die body 40. Consequently, as shown in FIG. 6(c), a plurality of through holes 43 is formed in the thickness direction of the bump-forming die body 40. Because the through hole 43 may be etched from the both main surfaces of the bump-forming die body 40, the diameter near the center of the through hole 43 is smaller than the diameter of both openings of the through hole 43.

As shown in FIG. 6(d), the dry film resist 42 may be stripped. Referring to FIG. 6 (e), a bump-forming die lid 44 may be press-welded to the main surface on one side of the bump-forming die body 40 by high-temperature pressing so as to form a bump-forming recess 45.

As shown in FIG. 6(f), electrolytic nickel plating may be implemented to a continuous surface from a surface 40a of the bump-forming die body 40 in which the bump-forming recesses 45 are formed up to the inner surface of the bump-forming recess 44 so as to form a nickel plating layer 47. Electrolytic copper plating may be implemented on the nickel plating layer 47 so as to form a copper plating layer 48. Here, in the adjacent bump-forming recesses 45, the nickel plating layer 47 and the copper plating layer 48 are formed continuously from the interior of one of the bump-forming recesses up to the interior of the other bump-forming recess.

As shown in FIG. 7(g), the copper plating layer 48 may be pattern-etched with the nickel plating layer 47 used as an etching barrier layer. Consequently, part of the nickel plating layer 47 covering the plane 40a between the adjacent bump-forming recesses 44 is exposed. As shown in FIG. 7(h), an insulation layer 49 may be comprised of dielectric material that is formed such that it fills the interior of the bump-forming recess 45 covered with the copper plating layer 48 and covers the surface of the exposed nickel plating layer 47 and the surface of the copper plating layer 48.

As shown in FIG. 7(i), the bump-forming die body 40 and the bump-forming die lid 44 comprised, for example, of a rolled copper foil may be removed by alkaline etching with the nickel plating layer 47 used as an etching barrier layer. The nickel plating layer 47 may be removed by stripping the nickel. Consequently, a plurality of bumps 50 comprised of the copper plating layer 48 is produced. Here, the bumps 50 have a cylindrical configuration whose side face is constricted slightly near the center in the height direction, depending on the configuration of the through hole 43.

Referring to FIG. 7(j), a solder mask layer 52 may be formed on a plane 51 from which the bumps 50 are projected and which is comprised of the insulation layer 49 and the copper plating layer 48. As shown in FIG. 7(k), electroless gold plating may be implemented to the surface of the bump 50 so as to form a gold plating layer 53. Further, to prevent diffusion of gold, the electroless nickel plating may be implemented to the surface of the bump 50 so as to form the nickel plating layer (not shown) before the gold plating is executed.

The bump 50 formed according to this embodiment can be used as a connecting means for mounting a semiconductor chip onto a mother board (printed board) using, for example, flip-chip method.

Figure 8:
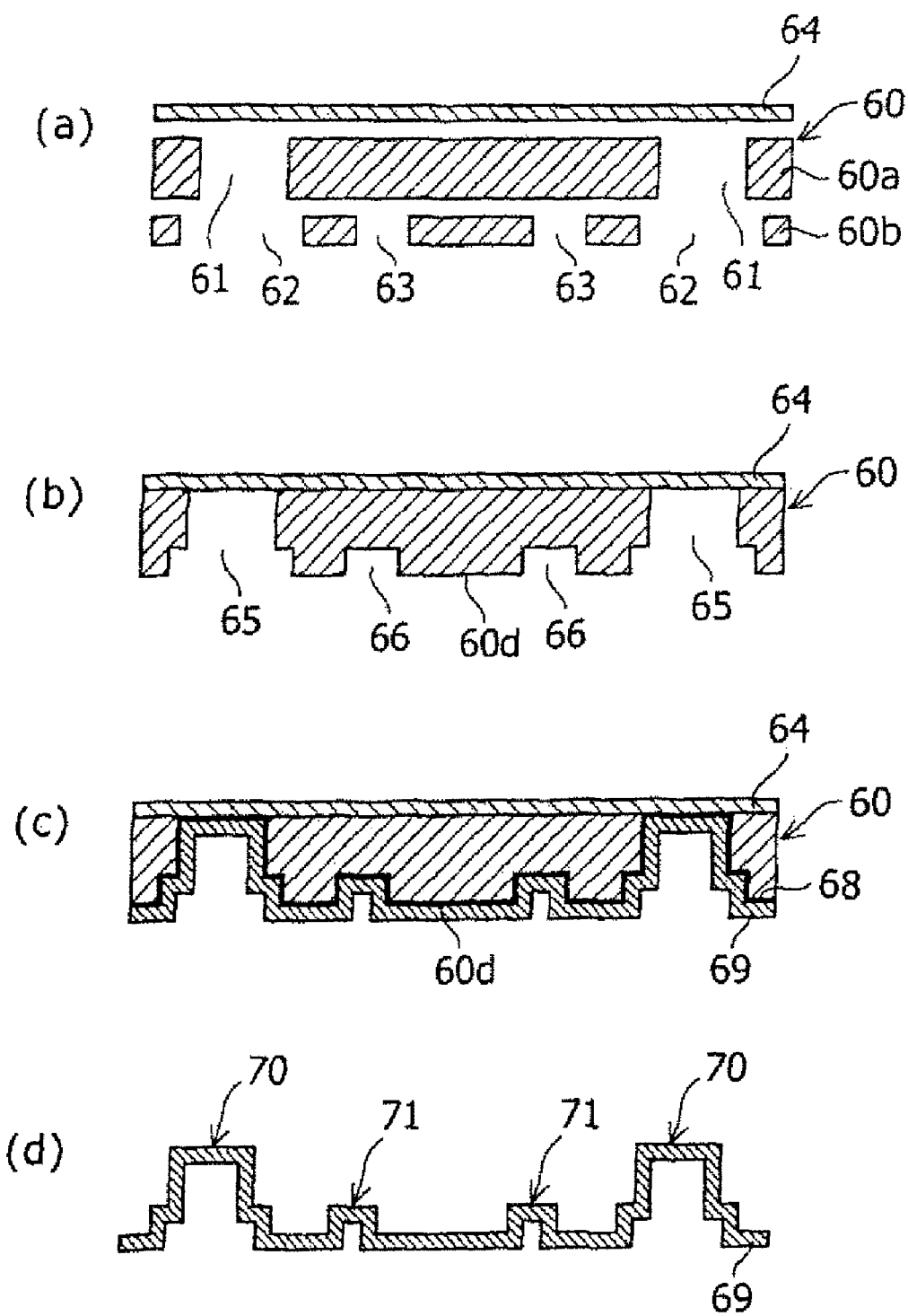
FIGS. 8($a$)-($d$) are a schematic sectional views showing a fifth embodiment of the process for forming a bump structure in a sequence of steps.

Referring now to FIG. 8, a schematic sectional view shows another embodiment of the process for forming the bump structure of the present invention in the order of steps. First, a mandrel may be formed from a bump-forming die body and a bump-forming die lid 64. The bump-forming die body 60 is comprised of a plurality of metal sheets as shown in FIG. 8(a). In this embodiment, the bump-forming die body 60 may be comprised of a first metal member 60a comprised of the rolled copper foil and a second metal member 60b comprised of the rolled copper foil thinner than the first metal member 60a.

Through holes 61 may be formed in the first metal member 60a in the thickness direction using an NC drill. Here, the through holes 61 are formed at two positions of the first metal member 60a. Through holes 62, 63 are formed in the second metal member 60b in the thickness direction using the NC drill. The through hole 62 is formed at a position communicating with the through hole 61 formed in the first metal member 60a when the first metal member 60a and the second metal member 60b are disposed such that they overlap each other and the diameter of the through hole 62 is larger than that of the through hole 61. The through holes 63 are formed at two positions between the two through holes 62. Because no through hole is formed at a position corresponding to the through hole 63 in the first metal member 60a, when the first metal member 60a is overlaid on the second metal member 60b, the opening on one side of the through hole 63 is covered by the first metal member 60a.

The first metal member 60a may be overlaid on the second metal member 60b and a bump-forming die lid 64 comprised of the tabular rolled copper foil is overlaid on the first metal member 60a and those members are press-welded by high-temperature pressing. Consequently, as shown in FIG. 8(b), a bump-forming recess 65 and a bump-forming recess 66 having a smaller depth than the bump-forming recess 65 are formed. Because the diameter of the through hole 62 formed in the second metal member 60b may be larger than the diameter of the through hole 61 formed in the first metal member 60a, the bump-forming recess 65 is formed in a stepped recess having a large opening.

As shown in FIG. 8(c), electrolytic nickel plating is implemented to a continuous surface from a surface 60d of the bump-forming die body 60 in which openings of the bump-forming recesses 65, 66 are formed up to the inner surfaces of the bump-forming recesses 65, 66 so as to form a nickel plating layer 68. Electrolytic copper plating is implemented on the nickel plating layer 68 so as to form a copper plating layer 69. In the adjacent bump-forming recesses 65, 66 of this embodiment, the continuous nickel plating layer 68 and copper plating layer 69 are formed from the interior of one of the bump-forming recesses 65, 66 up to the interior of the other bump-forming recess 65, 66.

After that, as shown in FIG. 8(d), the mandrel, comprised of the bump-forming die body 60 and the bump-forming die lid 64 comprised of the rolled copper foil, may be removed by alkaline etching with the nickel plating layer 68 used as an etching barrier layer. The nickel plating layer 68 may be removed by stripping the nickel. Consequently, a plurality of bumps 70, 71 comprised of the copper plating layer 69 is produced. According to this embodiment, the bump 70 formed from the bump-forming recess 65 has a stepped configuration in which the diameter of its apex is smaller than the diameter of the bottom portion in a section taken along a height direction and is configured into a cylinder having steps as if cylinders having different outside diameters are stacked in a staircase pattern. The height of the bump 70 is larger than that of the bump 71 formed from the bump-forming recess 66.

As described above, in this embodiment, a plurality of the bumps having different heights can be formed. Thus, the bumps different in height can be used separately for applications, for example, the higher bump 70 is used for connecting to a mother board (printed board) while the lower bump 71 is used for connecting to a semiconductor chip.

Figure 9:
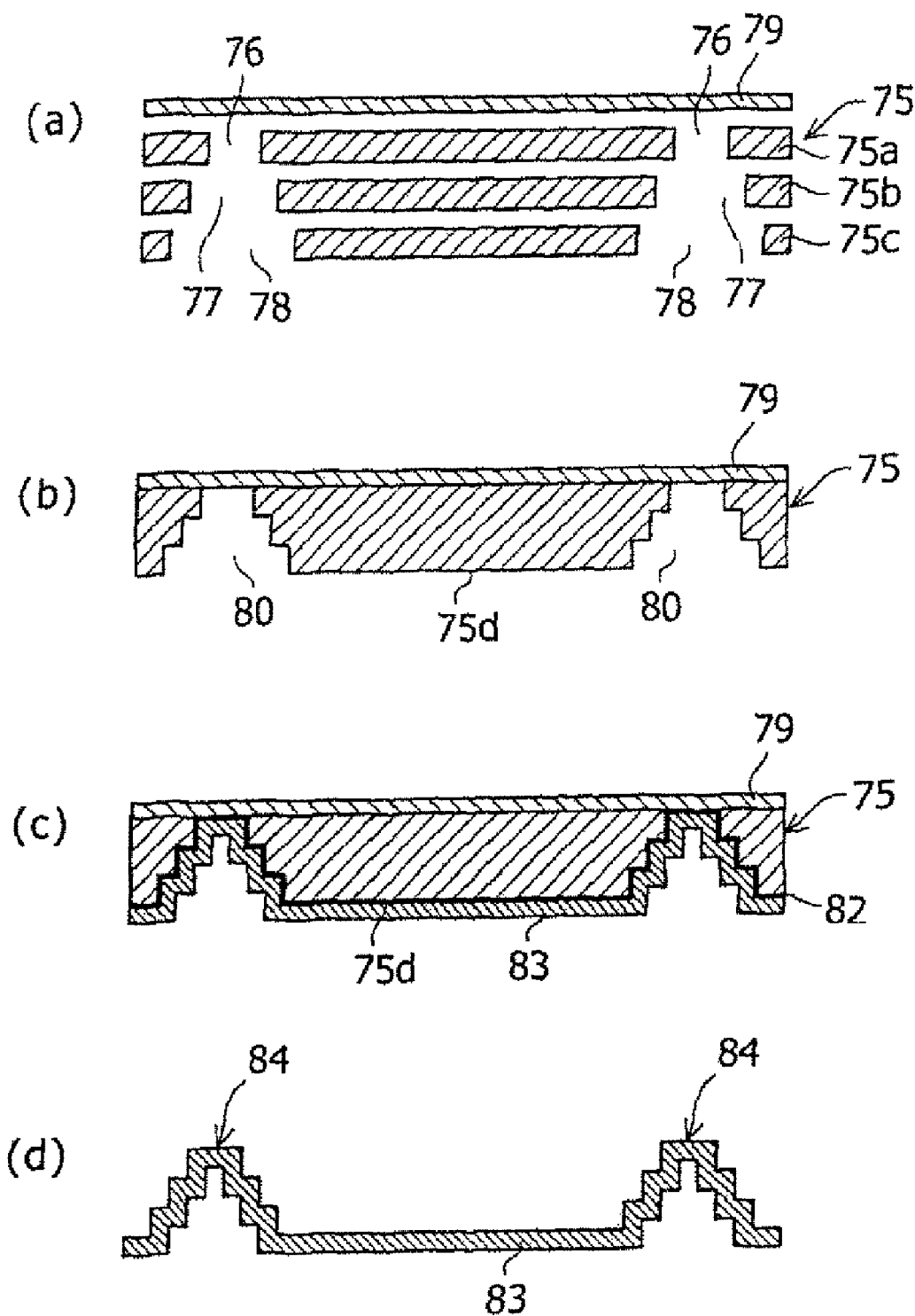
FIGS. 9($a$)-($d$) are a schematic sectional views showing a sixth embodiment of the process for forming a bump structure in a sequence of steps.

FIG. 9 is a schematic sectional view showing another embodiment of the process for forming a bump structure in a sequence of steps. First, a mandrel may be formed from a bump-forming die body 75 and bump-forming die lid 79. The bump-forming die body 75 comprised of a first metal member 75a, a second metal member 75b and a third metal member 75c as shown in FIG. 9(a) is prepared. In this embodiment, the respective metal members are rolled copper foils having the same thickness, although other metals known in the art may be used.

Through holes 76, 77, 78 may be formed in the first metal member 75a, the second metal member 75b and the third metal member 75c, respectively, using an NC drill. At this time, the respective through holes 76, 77, 78 are formed at positions communicating with each other when the metal members are overlaid and of the through holes 76, 77, 78, the diameter of the through hole 76 is the smallest while the diameter of the through hole 78 is the largest.

Of the respective metal members in which each through hole is formed, the second metal member 75b is overlaid on the third metal member 75c, and the first metal member 75a is overlaid on the second metal member 75b. Further, a bump-forming die lid 79 comprised of the tabular rolled copper foil is overlaid on the first metal member 75a and press-welded thereto by high-temperature pressing.

Once the mandrel is formed, as shown in FIG. 9(b), a bump-forming recess 80 is formed. The bump-forming recess 80 may be formed in a stepped recess configuration whose opening is the largest because the diameter of the through hole 76 is the smallest while the diameter of the through hole 78 is the largest.

As shown in FIG. 9(c), electrolytic nickel plating may be implemented to a continuous surface from a surface 75d of the bump-forming die body 75 in which the bump-forming recesses 80 are formed up to the inner surface of the bump-forming recess 80 so as to form a nickel plating layer 82. Electrolytic copper plating may be implemented to the nickel plating layer 82 so as to form a copper plating layer 83. In the adjacent bump-forming recesses 80 of this embodiment, the nickel plating layer 82 and the copper plating layer 83 may be formed such that they are continuous from the interior of one of the bump-forming recesses up to the interior of the other bump-forming recess.

After that, as shown in FIG. 9(d), the bump-forming die body 75 and the bump-forming die lid 79 comprised of a rolled copper foil may be removed by alkaline etching with the nickel plating layer 82 used as an etching barrier layer. Next, the nickel plating layer 82 is removed by stripping the nickel. Consequently, a plurality of the bumps 84 comprised of the copper plating layer 83 may be produced. According to this embodiment, the bump 84 has a stepped configuration in which the diameter of its apex is smaller than the diameter of the bottom portion in a section taken along a height direction and is configured into a cylinder having steps as if cylinders having different outside diameters are stacked in a staircase pattern.

According to this embodiment, a plurality of the metal members having each through hole is stacked so as to realize a larger bump height.

Figure 10:
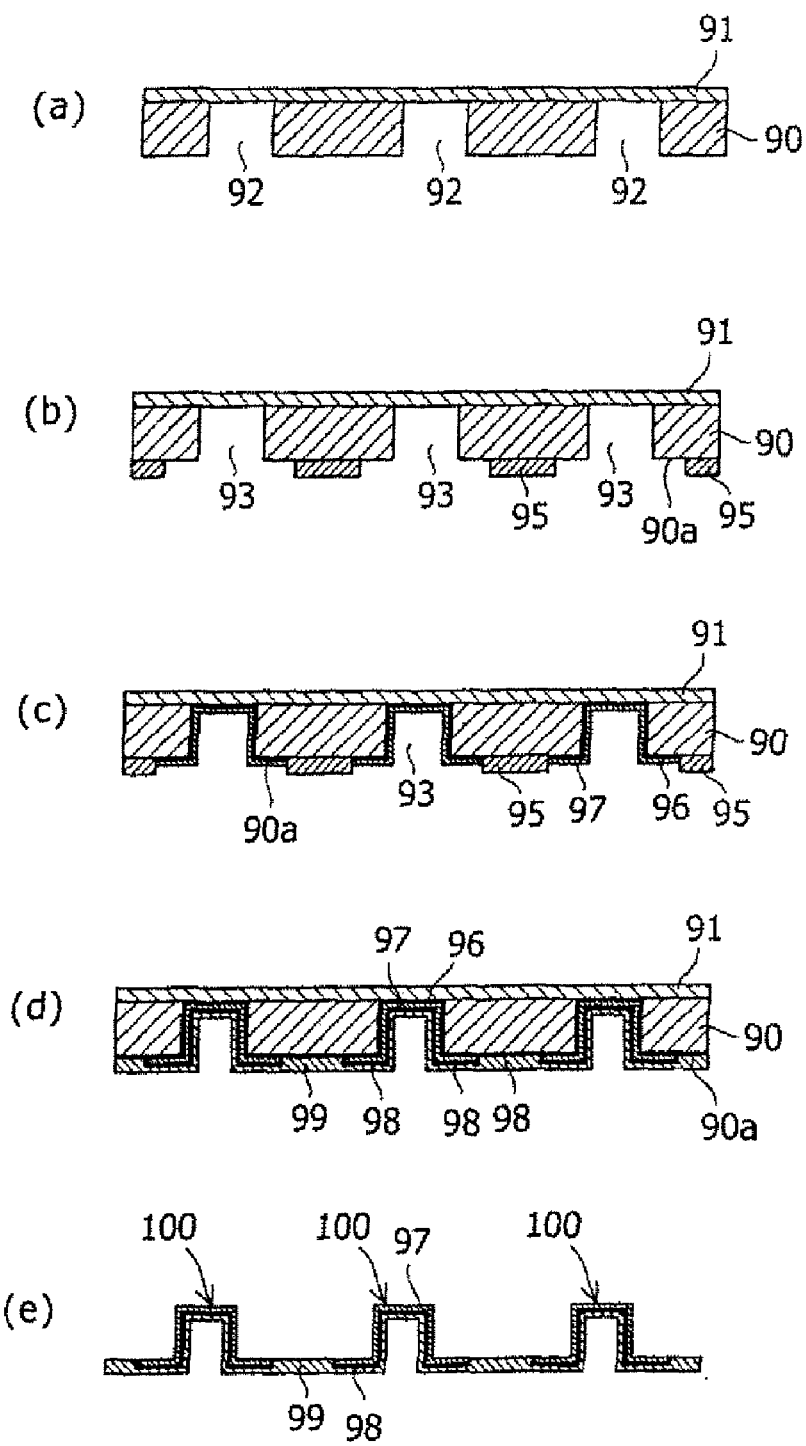
FIGS. 10($a$)-($e$) are a schematic sectional views showing a seventh embodiment of the process for forming a bump structure in a sequence of steps.

FIG. 10 is a schematic sectional view showing another embodiment of the process for forming the bump structure of the present invention in a sequence of steps As shown in FIGS. 10(a)-(b), the process for forming a bump-forming recess 93 includes forming a mandrel from a bump-forming die body 90 and a bump-forming die lid 91. Referring to FIG. 10(a), through holes 92 are formed in a bump-forming die body 90 comprised of the rolled copper foil and then press-welding a bump-forming die lid 91 comprised of the rolled copper foil onto the bump-forming die body 90 having through holes 92 is the same as the embodiment of FIGS. 1(a)-(d).

Referring to FIG. 10(b), plating resist 95 is attached to a surface 90a of the bump-forming die body 90 having openings of the bump-forming recesses 93. On the surface 90a, the plating resist 95 is attached to expose the periphery of the opening of each bump-forming recess 93.

After that, as shown in FIG. 10(c), electrolytic nickel plating may be implemented to a continuous surface from the surface 90a up to the inner surface of the bump-forming recess 93 so as to form a nickel plating layer 96. Subsequently, electrolytic gold plating is implemented to the nickel plating layer 96 so as to form a gold plating layer 97. The plating resist 95 is removed after the nickel plating layer 96 and the gold plating layer 97 are formed.

Referring to FIG. 10(d), electrolytic nickel plating may be implemented to a continuous surface from the surface 90a of the bump-forming die body 90 up to the inner surface of the bump-forming recess 93 so as to form a nickel plating layer 98. Here, the nickel plating layer 98 may be stacked to cover the gold plating layer 97 and the surface 90a. In the adjacent bump-forming recess 93, the nickel plating layer 98 is formed continuously from the interior of one of the bump-forming recesses up to the interior of the other bump-forming recess. The nickel plating layers 96, 98 take a role as the etching barrier layer described later and also a role of preventing diffusion of gold from the nickel plating layer 97. Electrolytic copper plating may be implemented on the nickel plating layer 98 so as to form a copper plating layer 99. In the adjacent bump-forming recesses 93, the copper plating layer 99 may be formed continuously from the interior of one of the bump-forming recesses up to the interior of the other bump-forming recess.

After that, as shown in FIG. 10(e), the mandrel, comprised of the bump-forming die body 90 and the bump-forming die lid 91 comprised of a rolled copper foil, may be removed by alkaline etching with part of the nickel plating layer 96 and the nickel plating layer 98 used as an etching barrier layer. Part of the nickel plating layer 96 and the nickel plating layer 98 used as the etching barrier layer may be removed by stripping the nickel. A plurality of bumps 100 whose surface is covered with the gold plating layer 97 is obtained by the removal of the mandrel, comprised of the bump-forming die body 90 and the bump-forming die lid 91, described above and stripping of the nickel.

In other embodiments, the nickel plating layer and the gold plating layer covering the surface of the bumps may be formed by electroless plating. The reason is that a substrate having the bumps cannot be provided with any bus bar necessary for electrolytic plating because its wiring pattern is at a high density. According to this embodiment, contrary to this, the nickel plating layer 98 and the gold plating layer 97 can be formed by electrolytic plating without use of any bus bar because they are applied to the inner surface of the bump-forming recess 93 defined by the rolled copper foil.

By forming the gold plating layer 97 by plating the bump-forming recess 93, the dispersion of a height of the bumps after the gold plating layer 97 is formed between the bumps can be reduced and the surface of the gold plating layer 97 covering the top face of the bump 100 can be made more flat.

Figure 11:
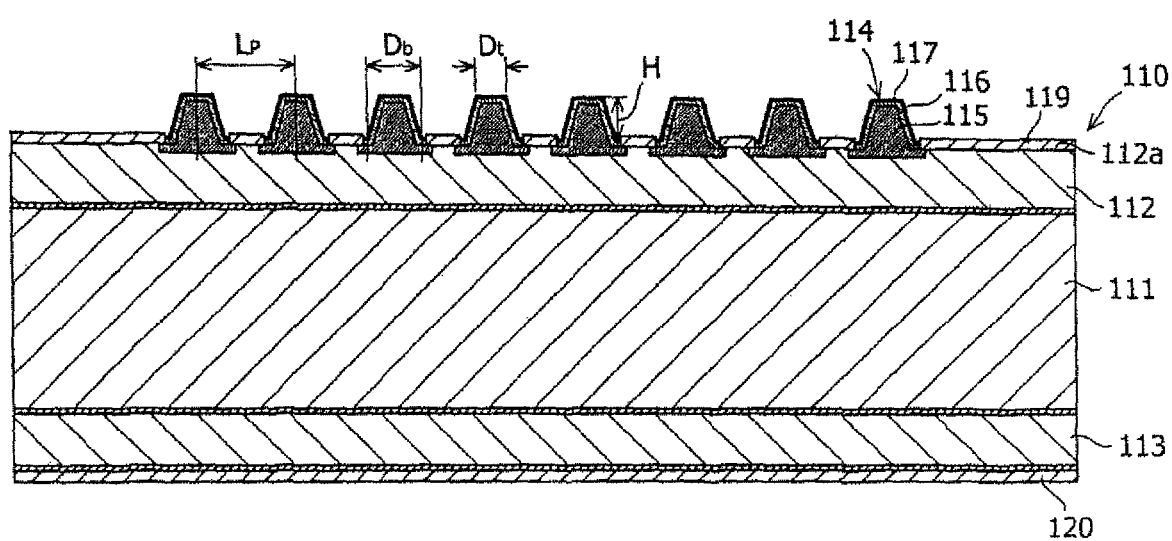
FIG. 11 is a sectional view showing schematically a circuit board in which a plurality of the bumps of an eighth embodiment is formed.

Referring now to FIG. 11, a sectional view showing schematically a circuit board having bumps of another embodiment is shown. In a circuit board 110, insulation layers 112, 113 comprised of dielectric material such as glass cloth epoxy prepreg are overlaid on both main surfaces of a substrate 111 comprised of high Tg epoxy multilayer material or the like. A plurality of bumps 114 is projected outward from the surface of the insulation layer 112 overlaid on the main surface on one side of the substrate 111. The interior of the bump 114 is filled with a copper plating layer 115 and a nickel plating layer 116 and a gold plating layer 117 are formed on the surface of the copper plating layer 115. A solder mask layer 119 is formed on a surface 112a of the insulation layer 112 from which the bumps 114 are projected. Further, a solder mask layer 120 is formed on the surface of the insulation layer 113 on the other side.

Figure 12:
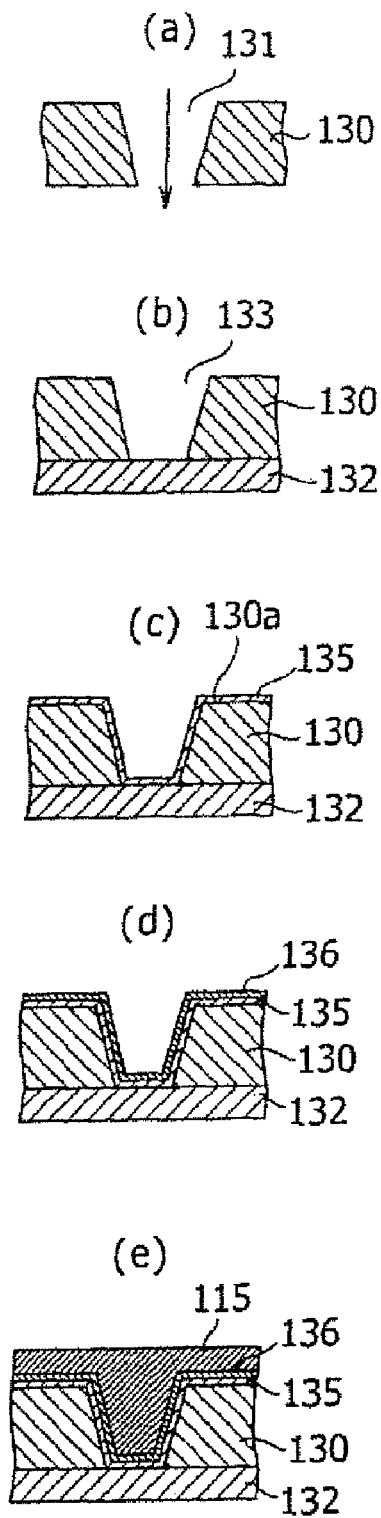
FIGS. 12($a$)-($e$) are a schematic sectional views showing the eighth embodiment of the process for forming a bump structure in a sequence of steps.

A formation process of the bump 114 shown in FIG. 11 will be described with reference to FIGS. 12 to 14. Because a plurality of the bumps 114 is formed in the same way, respectively, one bump 114 will be picked up for explanation.

First, as shown in FIGS. 12(a) and 12(b), a mandrel may be formed from a bump-forming die body 130 and a bump-forming die lid 132. Referring to FIG. 12(a), a through hole 131 may be formed in the bump-forming die body 130 using a laser drill. The bump-forming die body 130 may be comprised of a flat rolled copper foil having a thickness, for example, of 75 µm. In this embodiment, the through hole 131 is configured so that its inner side face is inclined such that the diameter of an opening on one side is smaller than the diameter of an opening on the other side. Further, according to this embodiment, as an example, the diameter of the opening having a larger diameter is set to about 85 µm while the diameter of the opening having a smaller diameter is set to about 35 µm.

A bump-forming die lid 132 may be comprised of a flat rolled copper foil overlaid on the main surface of the bump-forming die body 130 having a smaller opening of the through hole, 131 and press-welded thereto by high-temperature pressing as shown in FIG. 12(b) so as to form a bump-forming recess 133. A flat rolled copper foil having a thickness, for example, of 50 µm, may comprise the bump-forming die lid.

As shown in FIG. 12(c), electroless copper plating may be implemented to a continuous surface from a surface 130a of the bump-forming die body 130 having openings of the bump-forming recesses 133 up to the inner surface of the bump-forming recess 133 so as to form a copper plating layer 135 having a thickness of about 2 µm. The copper plating layer 135 is formed to seal a gap generated on a corner where the bump-forming die body 130 and the bump-forming die lid 132 make a contact with each other. As shown in FIG. 12(d), electrolytic nickel plating may be implemented on the copper plating layer 135 so as to form a nickel plating layer 136 having a thickness of about 3 to 5 µm. By implementing electrolytic copper plating as shown in FIG. 12(e), a copper plating layer 115, which fills the interior of the bump-forming recess 133 and covers the nickel plating layer 136 overlaid on the surface 130a via the copper plating layer 135, is formed.

As shown in FIG. 13(f), the copper plating layer 115 may be alkaline-etched selectively so as to form a wiring pattern. After that, as shown in FIG. 13(g), the insulation layer 112 and the substrate 111 may be laid together and press-welded. As an example, the thickness of the substrate 111 may be set to about 0.8 mm and the thickness of the insulation layers 112, 113 is set to about 0.1 mm.

Figure 13:
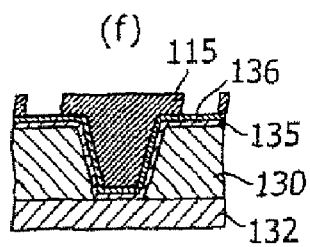
FIGS. 13($f$)-($i$) are a schematic sectional views showing the eighth embodiment of the process for forming a bump structure in a sequence of steps.
Figure 13:
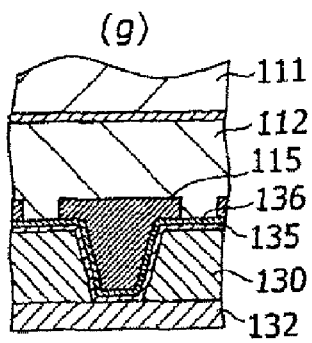
Figure 13:
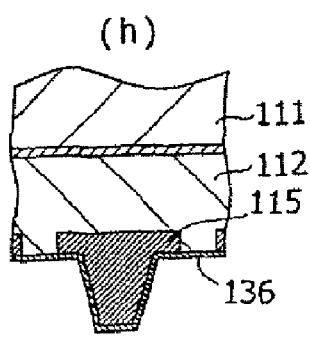
Figure 13:
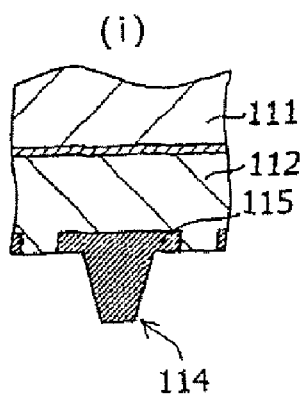
Figure 14:
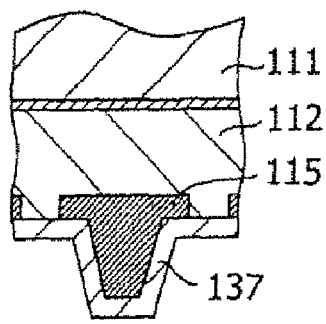
FIGS. 14($j$)-($l$) are a schematic sectional views showing the eighth embodiment of the process for forming a bump structure in a sequence of steps.
Figure 14:
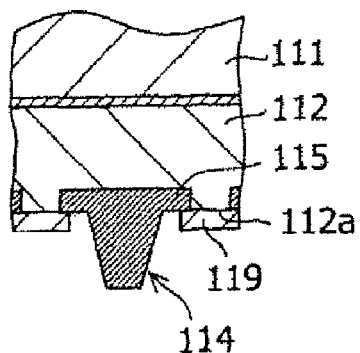
Figure 14:
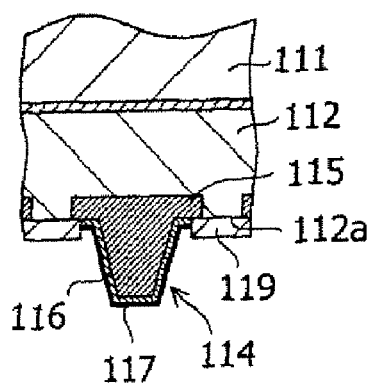

After that, as shown in FIG. 13(*h*), the bump-forming die body 130 comprised of a rolled copper foil and the bump-forming die lid 132 may be removed by alkaline etching with the nickel plating layer 136 used as an etching barrier layer. At this time, the copper plating layer 135 formed for sealing the gap may also be removed.

Referring to FIG. 13(*i*), the nickel plating layer 136 may be removed by stripping the nickel. Consequently, the bumps 114 can be obtained. The bump 114 is configured into frusto-conical depending on the configuration of the bump-forming recess 133. Because FIG. 13(*i*) represents the bump 114 such that it is projected downward, the inverted frusto-conical section is indicated as the bump 114. As shown in FIG. 14(*j*), photosensitive material such as photo resist may be applied to the surface of the bump 114 and the insulation layer 112 exposed outside by spraying, so as to form a photosensitive material layer 137 having a thickness of about 25 μm. As shown in FIG. 14(*k*), the photosensitive material layer 137 is exposed to light selectively so as to expose the bump 114 and developed so as to form a solder mask layer 119 on a plane 112*a* from which the bump 114 is projected. After that, as shown in FIG. 14(*l*), electroless nickel plating may be implemented to the entire surface of the bump 114 so as to form a nickel plating layer 116 having a thickness of about 3 μm. Electroless gold plating may be implemented on the nickel plating layer 116 so as to form a gold plating layer 117 having a thickness of about 0.05 μm.

According to this embodiment, by setting a distance between the centers of the adjacent through holes 131 to 0.13 mm, the pitch Lp of the adjacent bumps 114 in FIG. 11 is set to 0.13 mm. The diameter Db of the bottom portion of the bump 114 may be 85 μm, the diameter Dt of the top face may be 3.5 μm and the height H may be 75 μm. However, as described above, the height, the top face diameter and bottom portion diameter of each bump can be adjusted to each desired value by changing the thickness of the metal member which constitutes the bump-forming die body 130 and/or the diameter of the through hole 131. Thus, a bump having a larger height and/or a higher aspect ratio can be achieved. Additionally, the distance between the adjacent bumps can be decreased further by shortening the distance between the adjacent through holes 131 when the through holes 131 are formed.

According to this embodiment, by setting a distance between the centers of the adjacent through holes 131 to 0.13 mm, the pitch Lp of the adjacent bumps 114 in FIG. 11 may be set to 0.13 mm. The diameter Db of the bottom portion of the bump 114 may be 85 μm, the diameter Dt of the top face may be 35 μm and the height H may be 75 μm. However, as described above, the height, the top face diameter and bottom portion diameter of each bump can be adjusted to each desired value by changing the thickness of the metal member which constitutes the bump-forming die body 130 and/or the diameter of the through hole 131. Thus, a bump having a larger height and/or a higher aspect ratio can be achieved. Additionally, the distance between the adjacent bumps can be decreased further by shortening the distance between the adjacent through holes 131 when the through holes 131 are formed.

Figure 15:
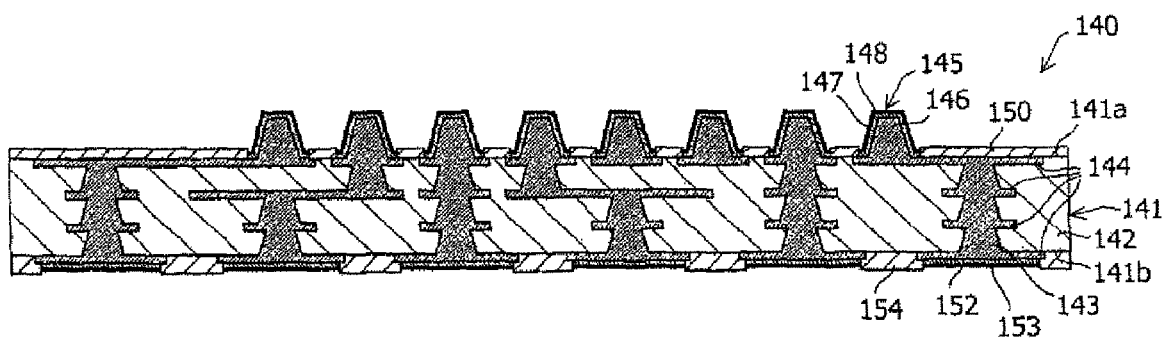
FIG. 15 is a sectional view showing schematically a circuit board in which a plurality of the bumps of a ninth embodiment is formed.

FIG. 15 is a sectional view showing schematically a multilayered circuit board having bumps according to another embodiment. A build-up layer 141 of a multilayered wiring board 140 has an insulation layer 142 comprised of three layers formed of dielectric material such as glass cloth epoxy prepreg. Each insulation layer comprising the insulation layer 142 may have a via 143 filled with copper plating and wiring patterns 144.

A plurality of bumps 145 may project outward from a main surface 141*a* on one side of the build-up layer 141. The interior of the bump 145 may be filled with a copper plating layer 146 and a nickel plating layer 147 and a gold plating layer 148 may be formed on the surface of the copper plating layer 146. A solder mask layer 150 may be formed on a surface 141*a* from which the bumps 145 are projected. The surface 141*a* may be comprised of the insulation layer 142 and the wiring pattern 144. On a main surface 141*b* on the other side of the build-up layer 141, a nickel plating layer 152 and a gold plating layer 153 are formed for covering the wiring pattern 144 and a solder mask layer 154 is provided between the respective wiring patterns 144 formed on the main surface 141*b*.

A formation process of the bump 145 shown in FIG. 15 will be described with reference to FIGS. 16 to 18. Because a plurality of the bumps 145 may be formed in the same way, one bump 145 will be picked up for explanation. The steps shown in FIGS. 16(*a*) to 16(*e*) are the same as the embodiment shown in FIGS. 11-14(*j*)-(*l*). At a step shown in FIG. 16(*e*), a copper plating layer 164 and a nickel plating layer 165 may be formed on the interior of a bump-forming recess 162 comprised of a bump-forming die body 160 and a bump-forming die lid 161, and a surface 160*a* of the bump-forming die body 160. Additionally, the copper plating layer 146 may be formed on the nickel plating layer 165 and the copper plating layer 146 fills the interior of the bump-forming recess 162. The copper plating layer 146 is alkaline-etched selectively so as to form a wiring pattern 144*a*.

Figure 16:
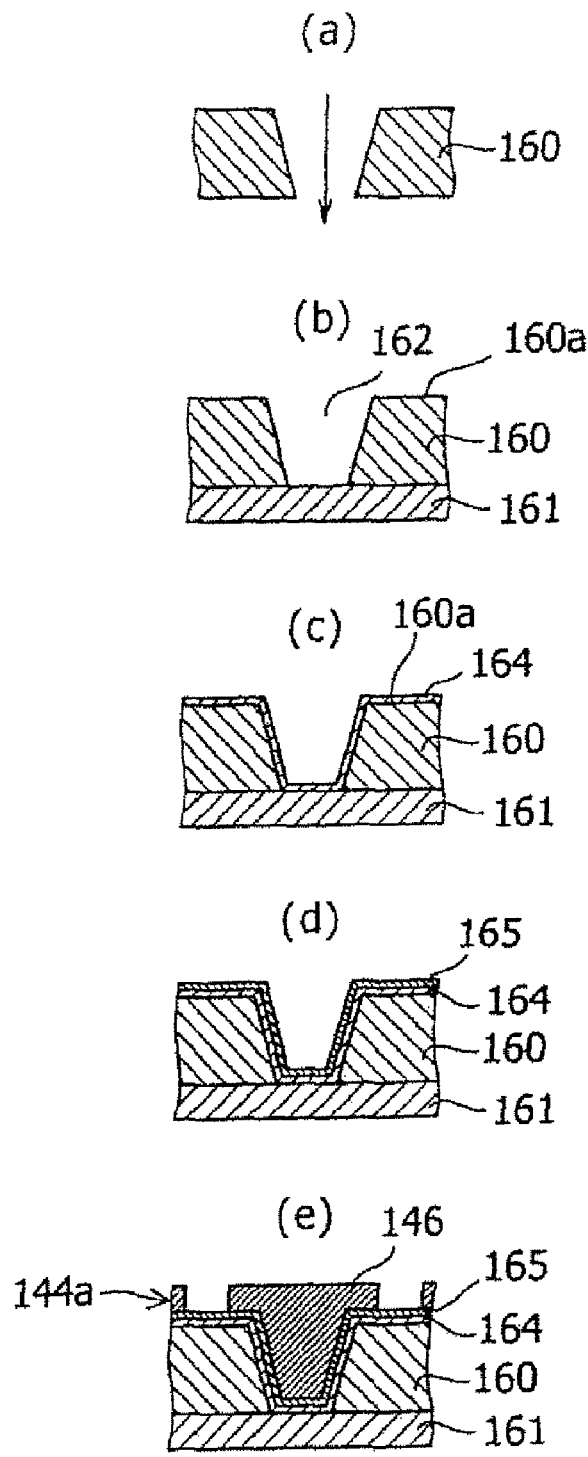
FIGS. 16($a$)-($e$) are a schematic sectional views showing the ninth embodiment of the process for forming a bump structure in a sequence of steps.
Figure 17:
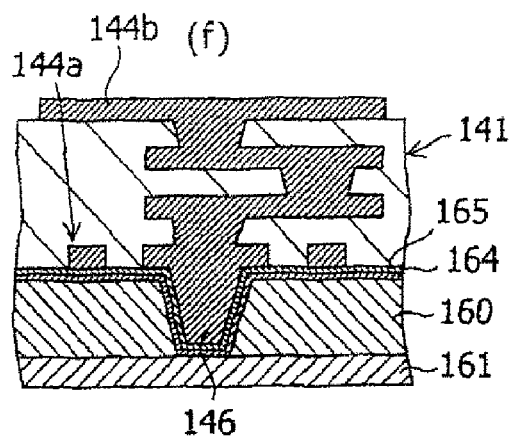
FIGS. 17($f$)-($h$) are a schematic sectional views showing the ninth embodiment of the process for forming a bump structure in a sequence of steps.
Figure 17:
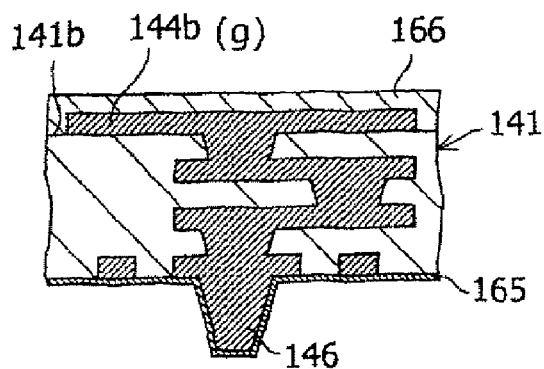
Figure 17:
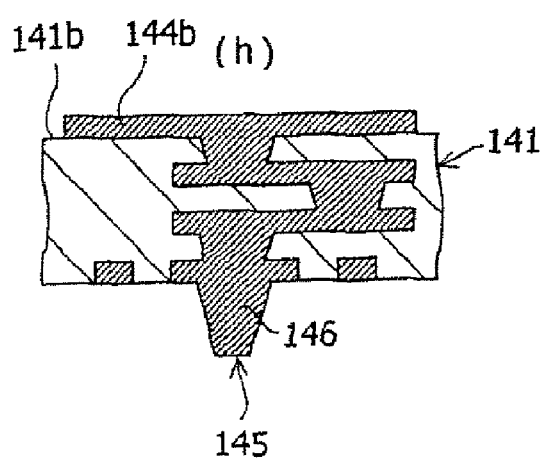

After FIG. 16(*e*), the build-up layer 141 is overlaid on the copper plating layer 146 and the nickel plating layer 165 as shown in FIG. 17 (*f*). The build-up layer 141 may be formed by forming a wiring pattern and filled via in a first insulation layer overlaid on the copper plating layer 146 and the nickel plating layer 165 according to a semi-additive method, and, implementing the same processing on a second layer and a third layer. A wiring pattern 144*b* may be formed on the surface of the third insulation layer, that is, the surface of the build-up layer 141.

As shown in FIG. 17(*g*), an etching resist layer 166 may be formed by covering the surface 141*b* of the build-up layer 141 and the wiring pattern 144*b* with etching resist. After that, the bump-forming die body 160 and the bump-forming die lid 161 comprised of the rolled copper foil may be removed by alkaline etching with the etching resist layer 166 and the nickel plating layer 165 used as etching resist. The copper plating layer 164 formed for sealing the gap may also be removed.

As shown in FIG. 17(*h*), the nickel plating layer 165 can be removed by stripping the nickel. Consequently, the bumps 145 can be obtained. As shown in FIG. 18(*i*), a photosensitive material layer 167 may be formed on the bumps 145 exposed outside and the surface 141*a* of the build-up layer 141 by spraying so as to form the photosensitive material such as photo resist. Further, a photosensitive material layer 168 may be formed on the main surface 141*b* on the other side of the build-up layer 141 such that the wiring pattern 144*b* is covered by spraying.

Figure 18:
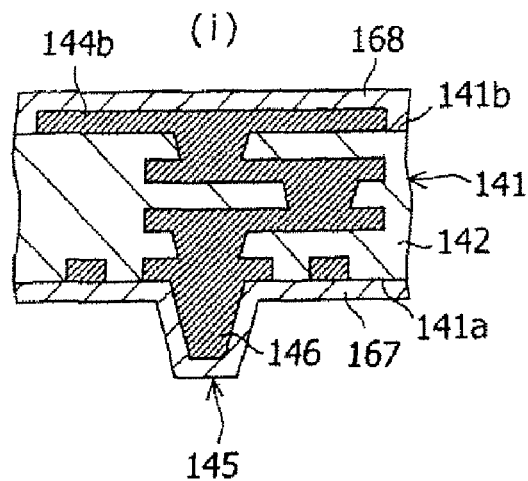
FIGS. 18($i$)-($k$) are a schematic sectional views showing the ninth embodiment of the process for forming a bump structure in a sequence of steps.
Figure 18:
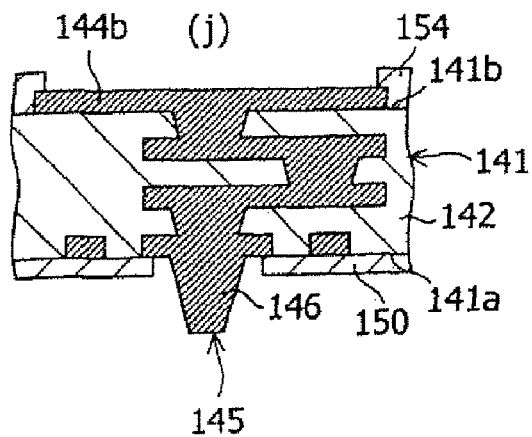
Figure 18:
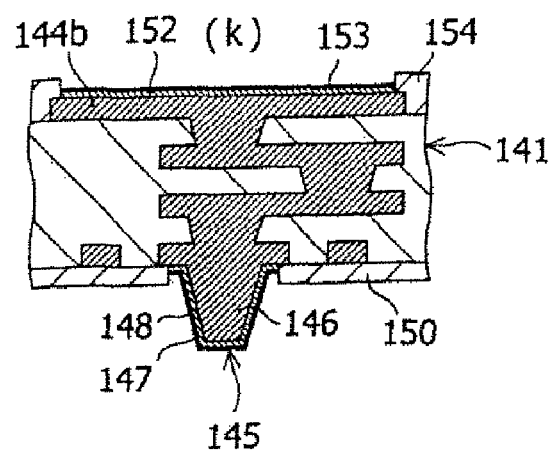
Figure 19:
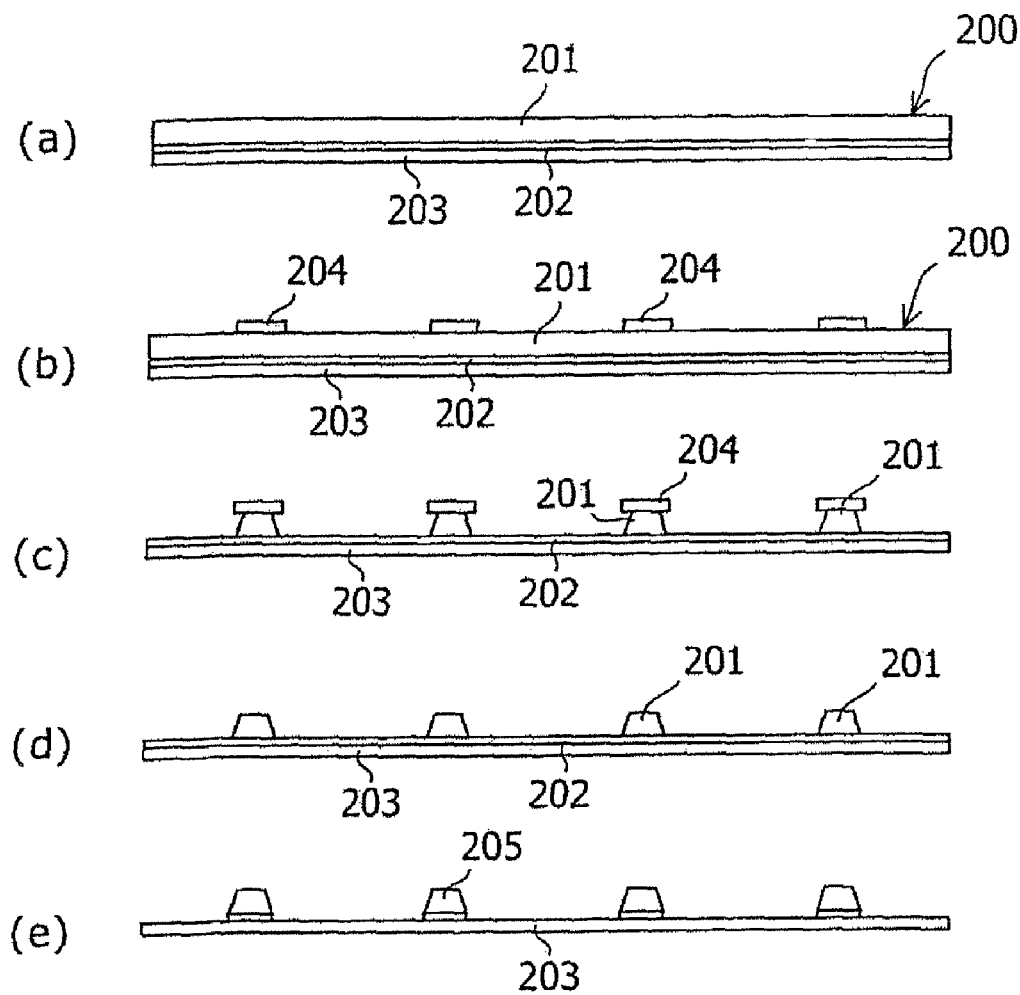
FIGS. 19($a$)-($e$) are a schematic sectional views showing a conventional process for forming the bump structure in a sequence of steps.

As shown in FIG. 18(*j*), the photosensitive material layer 167 may be exposed to light selectively and developed so as to expose the bump 145 so as to form a solder mask layer 150 on the plane 141*a* from which the bumps 145 are projected. Additionally, the photosensitive material layer 168 is exposed to light selectively and developed so as to expose the surface of the wiring pattern 144*b* so as to form the solder mask layer 154.

As shown in FIG. 18(*k*), electroless nickel plating may be implemented on the entire surface of the bump 145 so as to form the nickel plating layer 147. Electroless gold plating may be implemented on the nickel plating layer 147 so as to form the gold plating layer 148.

The bump-structure forming member in the above-described respective embodiments refers to a member in a state in which the metal layer formed in the bump-forming recess is not picked out from the mandrel, comprised of the bump-forming die body and the bump-forming die lid, but remains in the bump-forming recess. For example, in the embodiment of FIGS. 1(*a*)-(*d*), it is the member in a state shown in FIG. 1(*c*) and in the embodiment of FIGS. 11-14(*j*)-(*l*), it is the member in the state shown in FIG. 12(*e*) or FIG. 13(*f*). The bump-structure forming member may be in a state in which a wiring pattern has been already formed in the metal layer or in a state in which the wiring pattern has not been yet formed.

As described above, for example, a purchaser of the bump-structure forming member can form a wiring pattern on that member or overlay a circuit board. By removing the mandrel, comprised of the bump-forming die body and the bump-forming die lid, at a stage when a desired processing is completed, a desired circuit board having the bump structure can be achieved.

Although in the respective embodiments, use of an NC drill or laser drill or etching processing has been mentioned as a means for forming the through holes in the bump-forming die body, the through holes may be formed by punching or other means. Although in the respective embodiments, the rolled copper foils are used as metal materials which comprise the mandrel formed from the bump-forming die body and the bump-forming die lid, the embodiments should not be limited to such materials.

Additionally, although the respective embodiments have adopted a through hole having a circular opening as the through hole to be formed in the bump-forming die body, the present embodiments are not so limited. In the respective embodiments, by forming the through holes whose opening has other shape, the bumps having various shapes can be formed. For example, by forming the through holes whose opening has a rectangular shape, bumps having a rectangular column or truncated pyramid may be formed.

Although the respective embodiments have disclosed specific steps for forming the wiring pattern, the embodiments should not be limited to such steps. For example, the embodiment of FIGS. 15-18(*i*)-(*k*) adopts a subtractive method for forming the wiring pattern by alkaline etching after the copper plating layer 146 is formed. However, it is permissible to form the wiring pattern at the same time as the formation of the copper plating layer 146 which is overlaid in the interior of the bump-forming recess according to the semi additive method. In the semi additive method, a pattern is formed by implementing electrolytic or electroless plating to a portion coated with no resist while plating resist is formed at a portion in which no pattern is desired to be formed. In this case, from the state shown in FIG. 16(*d*), the copper plating layer 146, which may fill the interior of the bump-forming recess 162 and comprise a desired wiring pattern 144*a* can be formed by implementing electrolytic copper plating on the nickel plating layer 165, by forming the plating resist on that copper plating layer and by implementing the copper pattern plating. Further, from the state shown in FIG. 16(*c*), the copper plating layer 146, which fills the interior of the bump-forming recess 162 and constitutes a desired wiring pattern 144*a*, can be formed by forming plating resist on the copper plating layer 164 and after that, by implementing the electrolytic nickel plating and the electrolytic copper plating.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for forming a bump structure for conductive interconnection with another element that has at least one of microelectronic devices or wiring thereon, wherein the bump structure is used as an electric connection in an electronic circuit, comprising the steps of:
    forming a mandrel by steps including:
        forming at least one opening extending through a bump-forming die body in a thickness direction thereof, the bump-forming die body being comprised of a metal sheet; and
        positioning a bump-forming die lid on a surface of the bump-forming die body so as to cover one end of the opening to form the mandrel that includes the bump forming die body and the bump-forming die lid and to thereby define a bump-forming recess in the mandrel;
    forming a metal layer at least on an inner surface of the bump-forming die lid exposed within the bump-forming recess; and
    removing the mandrel so as to expose the metal layer and form the bump structure.

2. The method for forming the bump structure as claimed in claim 1, wherein an NC drill, punching, or laser machining is used to form said at least one opening.

3. The method for forming the bump structure as claimed in claim 1, wherein the bump-forming die body includes opposed surfaces and is etched from the opposed surfaces to form the at least one opening.

4. The method for forming the bump structure as claimed in claim 1, wherein the step of forming the metal layer includes plating a metal on exposed top surfaces of said bump-forming die body and within said bump-forming recess.

5. The method for forming the bump structure as claimed in claim 4, wherein the metal layer is formed by pattern-plating.

6. The method for forming the bump structure as claimed in claim 5, wherein a wiring pattern is formed.

7. The method for forming the bump structure as claimed in claim 6, further comprising forming the wiring pattern and then etching the metal layer.

8. The method for forming the bump structure as claimed in claim 1, further comprising depositing a gold-plated layer on the inner surface of the bump-forming recess, and then disposing the metal layer on a surface of the gold-plated layer.

9. The method for forming the bump structure in claim 1, further comprising using high temperature pressing to press-weld the bump-forming die lid against the bump-forming die body.

10. The method for forming the bump structure as claimed in claim 1,
    wherein the bump-forming die body and the bump-forming die lid are copper-based metal members,
    wherein the metal layer is formed as a copper-based metal layer by forming a nickel-based metal layer as an etching barrier layer on an inner surface of the bump-forming recess and then plating a copper-based metal upon the etching barrier layer, wherein the bump-forming die body and the bump-forming die lid are etched using an alkaline etching solution, and then the etching barrier layer is removed.

11. The method for forming the bump structure as claimed in claim 1,
wherein the metal sheet of the bump-forming die body is formed by stacking a plurality of metallic foils on top of one another,
wherein the step of forming the at least one opening comprises forming a hole in each of the plurality of metallic foils, and wherein the plurality of metallic foils are stacked such that the holes in each of the metallic foils are aligned with each other so the at least one opening is elongated and extends through the bump-forming die body in the thickness direction.

12. The method for forming the bump structure as claimed in claim 11, wherein at least two of the holes in the plurality of foils have differing diameters.

13. The method for forming the bump structure as claimed in claim 11, wherein the step of forming the holes comprises forming a second opening in at least one of the plurality of metallic foils other than those metallic foils that contact the bump-forming die lid.

14. The method for forming the bump structure of claim 1, wherein the bump-forming die body has a top surface and a bottom surface remote from the top surface and the opening is formed such that a wall of the opening is substantially perpendicular to at least one of the top and bottom surfaces.

15. The method of claim 14, wherein a drilling process is used to form the opening.

16. The method of claim 1, wherein a first diameter of a first end of the at least one opening at the top surface and a second diameter of a second end of the at least one opening at the bottom surface of the bump-forming die body are substantially the same.

17. The method for forming the bump structure according to claim 1, wherein the step of removing the mandrel comprises removing the mandrel along a wall of the bump structure which extends upwardly from an end of the bump structure adjacent the bump-forming die lid.

18. A method for manufacturing a bump-structure forming member for electrical connection to an electronic circuit, comprising the steps of:
forming a mandrel by steps including:
forming at least one opening extending through a bump-forming die body in a thickness direction, the bump-forming die body comprising a first metal sheet; and
positioning a bump-forming die lid comprising a second metal sheet against a surface of the bump-forming die body so as to cover one end of the opening to form the mandrel that includes the bump-forming die body and the bump-forming die lid and to thereby define a bump-forming recess in the mandrel; and
forming a metal layer on at least an inner surface of the bump-forming lid exposed within the bump-forming recess,
wherein the mandrel is usable to form at least one bump structure thereon by depositing a metal into the bump-forming recess thereof, and subsequently removing the mandrel to expose the at least one bump structure.

19. The method for forming the bump structure according to claim 18, wherein the mandrel is removable along a wall of the bump structure which extends upwardly from an end of the bump structure.

* * * * *